US012563876B2

(12) United States Patent
Wang et al.

(10) Patent No.: US 12,563,876 B2
(45) Date of Patent: Feb. 24, 2026

(54) DISPLAY PANEL, DISPLAY DEVICE, AND TILED DISPLAY APPARATUS

(71) Applicants: BOE MLED Technology Co., Ltd., Beijing (CN); BOE TECHNOLOGY GROUP CO., LTD., Beijing (CN)

(72) Inventors: Lili Wang, Beijing (CN); Chao Liu, Beijing (CN); Ming Zhai, Beijing (CN); Jing Wang, Beijing (CN); Sha Feng, Beijing (CN); Mingming Jia, Beijing (CN); Shaofei Guo, Beijing (CN); Bao Fu, Beijing (CN); Qiuhua Meng, Beijing (CN); Qi Qi, Beijing (CN); Lingyun Shi, Beijing (CN); Haiwei Sun, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 491 days.

(21) Appl. No.: 18/007,404

(22) PCT Filed: Feb. 25, 2022

(86) PCT No.: PCT/CN2022/078098
§ 371 (c)(1),
(2) Date: Jan. 30, 2023

(87) PCT Pub. No.: WO2023/159524
PCT Pub. Date: Aug. 31, 2023

(65) Prior Publication Data
US 2024/0258476 A1 Aug. 1, 2024

(51) Int. Cl.
*H10H 20/857* (2025.01)
*H01L 25/075* (2006.01)

(52) U.S. Cl.
CPC ....... *H10H 20/857* (2025.01); *H01L 25/0753* (2013.01)

(58) Field of Classification Search
CPC .......... G09F 9/33; G09G 3/32; H10H 20/857; G02F 1/133; H10D 86/00; H01L 25/0753
See application file for complete search history.

(56) References Cited

U.S. PATENT DOCUMENTS 11,282,994 B2 * 3/2022 Feng .................... G02F 1/13336
12,074,170 B2 * 8/2024 Park ...................... H01L 25/162
(Continued)

FOREIGN PATENT DOCUMENTS

CN 207938613 U 10/2018
CN 212256800 U 12/2020
(Continued)

*Primary Examiner* — Vinh T Lam
(74) *Attorney, Agent, or Firm* — Dority & Manning, P.A.

(57) ABSTRACT

A display panel includes: a backplane, light-emitting devices, first electrodes, and connection traces. The backplane includes a first surface, a second surface opposite thereto, and side surfaces connecting the two surfaces. At least one of the side surfaces is a selected side surface. The light-emitting devices are disposed on the first surface. The first electrodes are disposed on the first surface and are proximate to the selected side surface. Each connection trace includes a first trace segment, a second trace segment, and a third trace segment that are connected in sequence. The first trace segment is disposed on the first surface, and the first trace segment is electrically connected to a first electrode. The second trace segment is disposed on the selected side surface. The third trace segment is disposed on the second surface, and is configured to be electrically connected to a flexible printed circuit.

20 Claims, 16 Drawing Sheets

(56)         References Cited

U.S. PATENT DOCUMENTS

| | | | |
|---|---|---|---|
| 12,278,244 B2 * | 4/2025 | Gong | H10D 86/60 |
| 2020/0150804 A1 | 5/2020 | Wang et al. | |
| 2020/0301193 A1 * | 9/2020 | Lee | G02F 1/133308 |
| 2020/0355972 A1 | 11/2020 | Jian et al. | |
| 2020/0388636 A1 * | 12/2020 | Yueh | H01L 25/0655 |
| 2021/0343758 A1 | 11/2021 | Zhang et al. | |
| 2021/0399185 A1 | 12/2021 | Liu et al. | |
| 2022/0173296 A1 * | 6/2022 | Feng | G02F 1/13336 |
| 2023/0207318 A1 * | 6/2023 | Choi | H10K 59/131 |
| | | | 430/311 |
| 2023/0207733 A1 * | 6/2023 | Gong | H10H 20/01 |
| | | | 257/79 |
| 2024/0258477 A1 * | 8/2024 | Feng | H10H 20/857 |

FOREIGN PATENT DOCUMENTS

| | | | |
|---|---|---|---|
| CN | 113946077 A | 1/2022 |
| JP | 3633456 B2 | 3/2005 |
| JP | 2020056951 A | 4/2020 |

* cited by examiner

10000

DISPLAY PANEL, DISPLAY DEVICE, AND TILED DISPLAY APPARATUS

CROSS-REFERENCE TO RELATED APPLICATION

This application is a national phase entry under 35 USC 371 of International Patent Application No. PCT/CN2022/078098 filed on Feb. 25, 2022, which is incorporated herein by reference in its entirety.

TECHNICAL FIELD

The present disclosure relates to the field of display technologies, and in particular, to a display panel, a display device, and a tiled display apparatus.

BACKGROUND

Micro light-emitting diodes (Micro LED) are referred to as the third generation display technology. Micro-LED display devices may not be manufactured into over-sized products (e.g., a luxury display wall) under technological pressure such as mass transfer and dead pixel repair. Thus, for products of over-sized display screens, a good solution currently available is that these products are tiled by small-sized display screens.

SUMMARY

In an aspect, a display panel is provided. The display panel includes a backplane, a plurality of light-emitting devices, a plurality of first electrodes and a plurality of connection traces. The backplane includes a first surface, a second surface opposite to the first surface, and a plurality of side surfaces connecting the first surface with the second surface, at least one of the plurality of side surfaces is a selected side surface. The plurality of light-emitting devices being disposed on the first surface. The plurality of first electrodes are disposed on the first surface and proximate to the selected side surface. Each connection trace includes a first trace segment, a second trace segment and a third trace segment that are connected in sequence. The first trace segment is disposed on the first surface, and the first trace segment is electrically connected to a first electrode of the plurality of first electrodes; the second trace segment is disposed on the selected side surface; and the third trace segment is disposed on the second surface, and the third trace segment is configured to be electrically connected to a flexible printed circuit.

In some embodiments, the third trace segment includes a first sub-segment, a second sub-segment, and a third sub-segment that are connected in sequence, the first sub-segment is proximate to the selected side surface. First sub-segments of the plurality of connection traces are arranged in parallel, and third sub-segments of the plurality of connection traces are arranged in parallel. An extension direction of the first sub-segment intersects an extension direction of the second sub-segment, and the extension direction of the second sub-segment intersects an extension direction of the third sub-segment. An angle formed between the extension direction of the first sub-segment and the extension direction of the second sub-segment is in a range from 90° to 180°.

In some embodiments, the third trace segment further includes a first connection portion, and the first sub-segment and the second sub-segment are connected through the first connection portion. The first connection portion includes a first inner side surface and a first outer side surface that are opposite to each other, an orthographic projection of the first inner side surface on the backplane is a first inner edge, and an orthographic projection of the first outer side surface on the backplane is a first outer edge. The first sub-segment includes an inner side surface of the first sub-segment and an outer side surface of the first sub-segment that are opposite to each other, an orthographic projection of the inner side surface of the first sub-segment on the backplane is an inner edge of the first sub-segment, and an orthographic projection of the outer side surface of the first sub-segment on the backplane is an outer edge of the first sub-segment. The second sub-segment includes an inner side surface of the second sub-segment and an outer side surface of the second sub-segment that are opposite to each other, an orthographic projection of the inner side surface of the second sub-segment on the backplane is an inner edge of the second sub-segment, and an orthographic projection of the outer side surface of the second sub-segment on the backplane is an outer edge of the second sub-segment. The first inner edge is connected to the inner edge of the first sub-segment and the inner edge of the second sub-segment, and the first outer edge is connected to the outer edge of the first sub-segment and the outer edge of the second sub-segment.

In some embodiments, the first inner edge is a curve, and/or the first outer edge is a curve.

In some embodiments, the first inner edge is an arc, and/or the first outer edge is an arc.

In some embodiments, the first inner edge includes a plurality of broken line segments that are connected in sequence end-to-end. An angle formed between a broken line segment, in the plurality of broken line segments of the first inner edge, connected to the inner edge of the first sub-segment and the inner edge of the first sub-segment is in a range from 170° to 177°. An angle formed between two broken line segments that are connected to each other in the plurality of broken line segments of the first inner edge is in a range from 170° to 177°. An angle formed between a broken line segment, in the plurality of broken line segments of the first inner edge, connected to the inner edge of the second sub-segment and the inner edge of the second sub-segment is in a range from 170° to 177°.

In some embodiments, the first outer edge includes another plurality of broken line segments that are connected in sequence end-to-end. An angle formed between a broken line segment, in the plurality of broken line segments of the first outer edge, connected to the outer edge of the first sub-segment and the outer edge of the first sub-segment is in a range from 170° to 177°. An angle formed between two broken line segments that are connected to each other in the plurality of broken line segments of the first outer edge is in a range from 170° to 177°. An angle formed between a broken line segment, in the plurality of broken line segments of the first outer edge, connected to the outer edge of the second sub-segment and the outer edge of the second sub-segment is in a range from 170° to 177°.

In some embodiments, an angle formed between the extension direction of the third sub-segment and the extension direction of the second sub-segment is in a range from 90° to 180°.

In some embodiments, the third trace segment further includes a second connection portion, and the third sub-segment is connected to the second sub-segment through the second connection portion. The second connection portion includes a second inner side surface and second outer side surface that are opposite to each other, an orthographic projection of the second inner side surface on the backplane is a second inner edge, and an orthographic projection of the second outer side surface on the backplane is a second outer edge. The third sub-segment includes an inner side surface of the third sub-segment and an outer side surface of the third sub-segment that are opposite to each other, an ortho-graphic projection of the inner side surface of the third sub-segment on the backplane is an inner edge of the third sub-segment, and an orthographic projection of the outer side surface of the third sub-segment on the backplane is an outer edge of the third sub-segment. The second sub-segment includes an inner side surface of the second sub-segment and an outer side surface of the second sub-segment that are opposite to each other, an orthographic projection of the inner side surface of the second sub-segment on the backplane is an inner edge of the second sub-segment, and an orthographic projection of the outer side surface of the second sub-segment on the backplane is an outer edge of the second sub-segment. The second inner edge is connected to the inner edge of the third sub-segment and the inner edge of the second sub-segment, and the third outer edge is connected to the outer edge of the third sub-segment and the outer edge of the second sub-segment.

In some embodiments, the second inner edge is a curve, and/or the second outer edge is a curve.

In some embodiments, the second inner edge is an arc, and/or the second outer edge is an arc.

In some embodiments, the second inner edge includes a plurality of broken line segments that are connected in sequence end-to-end. An angle formed between a broken line segment, in the plurality of broken line segments of the second inner edge, connected to the inner edge of the third sub-segment and the inner edge of the third sub-segment is in a range from 170° to 177°. An angle formed between two broken line segments that are connected to each other in the plurality of broken line segments of the second inner edge is in a range from 170° to 177°. An angle formed between a broken line segment, in the plurality of broken line segments of the second inner edge, connected to the inner edge of the second sub-segment and the inner edge of the second sub-segment is in a range from 170° to 177°.

In some embodiments, the second outer edge includes a plurality of broken line segments that are connected in sequence end-to-end. An angle formed between a broken line segment, in the plurality of broken line segments of the second outer edge, connected to the outer edge of the third sub-segment and the outer edge of the third sub-segment is in a range from 170° to 177°. An angle formed between two broken line segments that are connected to each other in the plurality of broken line segments of the second outer edge is in a range from 170° to 177°. An angle formed between a broken line segment, in the plurality of broken line segments of the second outer edge, connected to the outer edge of the second sub-segment and the outer edge of the second sub-segment is in a range from 170° to 177°.

In some embodiments, the plurality of connection traces are divided into at least one group of connection traces, and each group of connection traces includes at least two con-nection traces. In each group of connection traces, an extension direction of first sub-segments and an extension direction of third sub-segments are the same, and a distance between outer edges of third sub-segments of two connec-tion traces that are farthest is less than a distance between outer edges of first sub-segments of the two connection traces that are farthest.

In some embodiments, in two adjacent connection traces in a same group of connection traces, a distance between two adjacent third sub-segments is less than a distance between two adjacent first sub-segments. The distance between the two adjacent third sub-segments is a distance between an outer edge of a third sub-segment and an inner edge of another third sub-segment, and the outer edge of the third sub-segment and the inner edge of the another third sub-segment are proximate to each other. The distance between the two adjacent first sub-segments is a distance between an outer edge of a first sub-segment and an inner edge of another first sub-segment, and the outer edge of the first sub-segment and the inner edge of the another first sub-segment are proximate to each other.

In some embodiments, in two adjacent groups of connec-tion traces, a distance between outer edges of third sub-segments of two connection traces that are closest is greater than 1000 μm.

In some embodiments, a junction between the second surface and each side surface of the plurality of side surfaces forms an edge-side, a junction between the second surface and the selected side surface forms a selected edge-side, and two edge-sides adjacent to the selected edge-side are a first edge-side and a second edge-side. In the plurality of con-nection traces, a distance between a third sub-segment of a connection trace closest to the first edge-side and the first edge-side is greater than or equal to 100 μm. In the plurality of connection traces, a distance between a third sub-segment of a connection trace closest to the second edge-side and the second edge-side is greater than or equal to 100 μm.

In some embodiments, a distance between first sub-segments of two adjacent connection traces in the group of connection traces is in a range from 10 μm to 60 μm.

In some embodiments, a distance between third sub-segments of two adjacent connection traces in the group of connection traces is greater than or equal to 10 μm.

In some embodiments, a ratio of a dimension of the first electrode in a direction perpendicular to an extension direc-tion thereof to a dimension of the connection trace electri-cally connected to the first electrode in a direction perpen-dicular to an extension direction thereof is in a range from 1 to 3.

In some embodiments, the angle formed between the extension direction of the first sub-segment and the exten-sion direction of the second sub-segment is in a range from 100° to 180°, and/or an angle formed between the extension direction of the third sub-segment and the extension direc-tion of the second sub-segment is in a range from 100° to 180°; and a dimension of the second sub-segment in the extension direction thereof is greater than or equal to 100 μm.

In some embodiments, the second surface includes a bonding area; the third sub-segment extends into the bond-ing area, and the third sub-segment is configured to bond the flexible printed circuit in the bonding area.

In some other embodiments, a plurality of third trace segments include a plurality of straight line segments that are arranged in parallel. A junction between the second surface and the selected side surface forms a selected edge-side, and two edge-sides adjacent to the selected edge-side are a first edge-side and a second edge-side. In the plurality of connection traces, a distance between a third trace segment of a connection trace closest to the first edge-side and the first edge-side is greater than or equal to 100 μm. In the plurality of connection traces, a distance between a third trace segment of a connection trace closest to the second edge-side and the second edge-side is greater than or equal to 100 μm.

In another aspect, a display device is provided. The display device includes the display panel provided by any one of the embodiments in the above aspect, a driver circuit board and a flexible printed circuit. The driver circuit board is disposed on the second surface of the backplane of the display panel, and the driver circuit board is electrically connected to the plurality of first electrodes of the display panel through the flexible printed circuit and the plurality of connection traces of the display panel.

In yet another aspect, a tiled display apparatus is provided. The tiled display apparatus includes a plurality of display devices each provided in the above aspect, the plurality of display devices being tiled together.

BRIEF DESCRIPTION OF THE DRAWINGS

Technical solutions in some embodiments of the present disclosure will be described clearly and completely with reference to the accompanying drawings below.

Obviously, the described embodiments are merely some but not all embodiments of the present disclosure. All other embodiments obtained by a person of ordinary skill in the art based on the embodiments of the present disclosure shall be included in the protection scope of the present disclosure. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
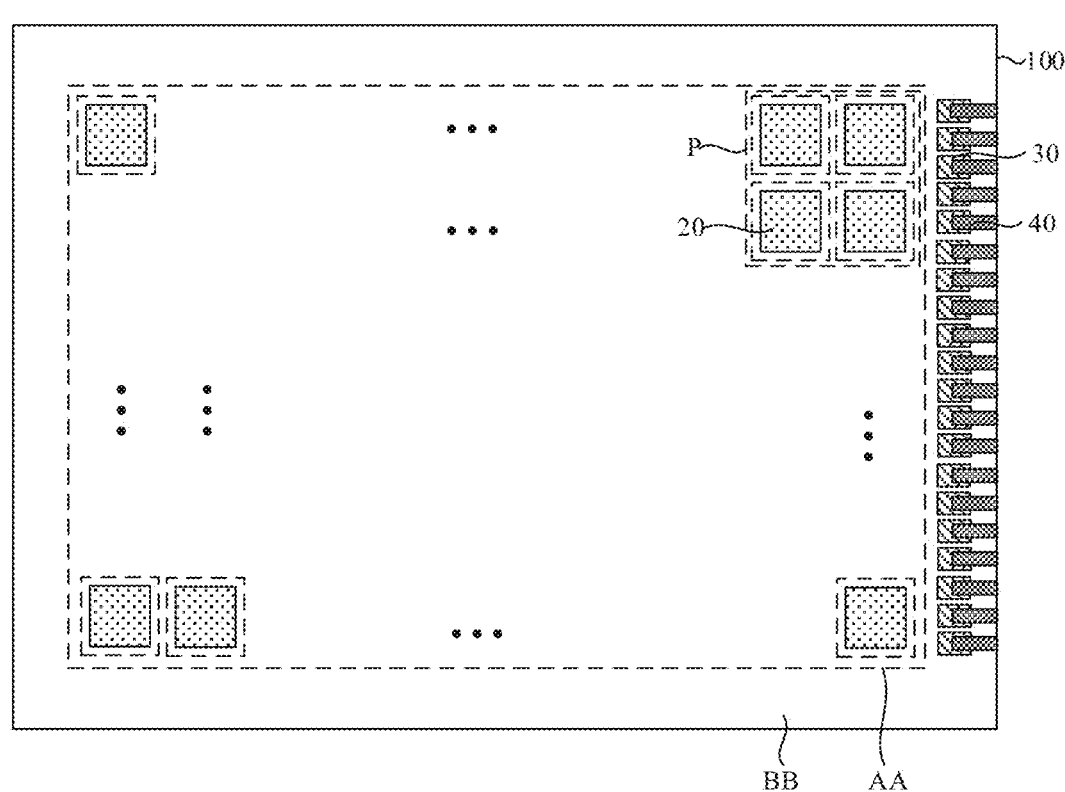
FIG. 1 is a diagram showing structures on a display surface of a display panel.

Technical solutions in some embodiments of the present disclosure will be described clearly and completely below with reference to the accompanying drawings. Obviously, the described embodiments are merely some but not all embodiments of the present disclosure. All other embodiments obtained by a person having ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with the terms such as "first" and "second" may explicitly or implicitly include one or more of the features. In the description of the embodiments of the present disclosure, the terms "a plurality of", "the plurality of" and "multiple" each mean two or more unless otherwise specified.

Some embodiments may be described using the terms "coupled", "connected" and their derivatives. For example, the term "connected" may be used when describing some embodiments to indicate that two or more components are in direct physical or electrical contact with each other. For another example, the term "coupled" may be used when describing some embodiments to indicate that two or more components have direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B, and C" has the same meaning as "at least one of A, B, or C", and both include the following combinations of A, B, and C: only A, only B, only C, a combination of A and B, a combination of A and C, a combination of B and C, and a combination of A, B and C.

The phrase "A and/or B" includes following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The phase "applicable to" or "configured to" as used herein indicates an open and inclusive expression, which does not exclude devices that are applicable to or configured to perform additional tasks or steps.

The terms such as "about", "substantially" or "approximately" as used herein include a stated value and an average value within an acceptable range of deviation of a particular value determined by a person of ordinary skilled in the art, considering measurement in question and errors associated with measurement of a particular quantity (i.e., limitations of a measurement system).

Exemplary embodiments are described herein with reference to segmental views and/or plan views as idealized exemplary drawings. In the accompanying drawings, thicknesses of layers and sizes of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but as including shape deviations due to, for example, manufacturing. For example, an etched region that is shown in a rectangle generally has a curved feature. Therefore, the regions shown in the accompanying drawings are schematic in nature, and their shapes are not intended to show actual shapes of regions in a device, and are not intended to limit the scope of the exemplary embodiments.

Figure 2:
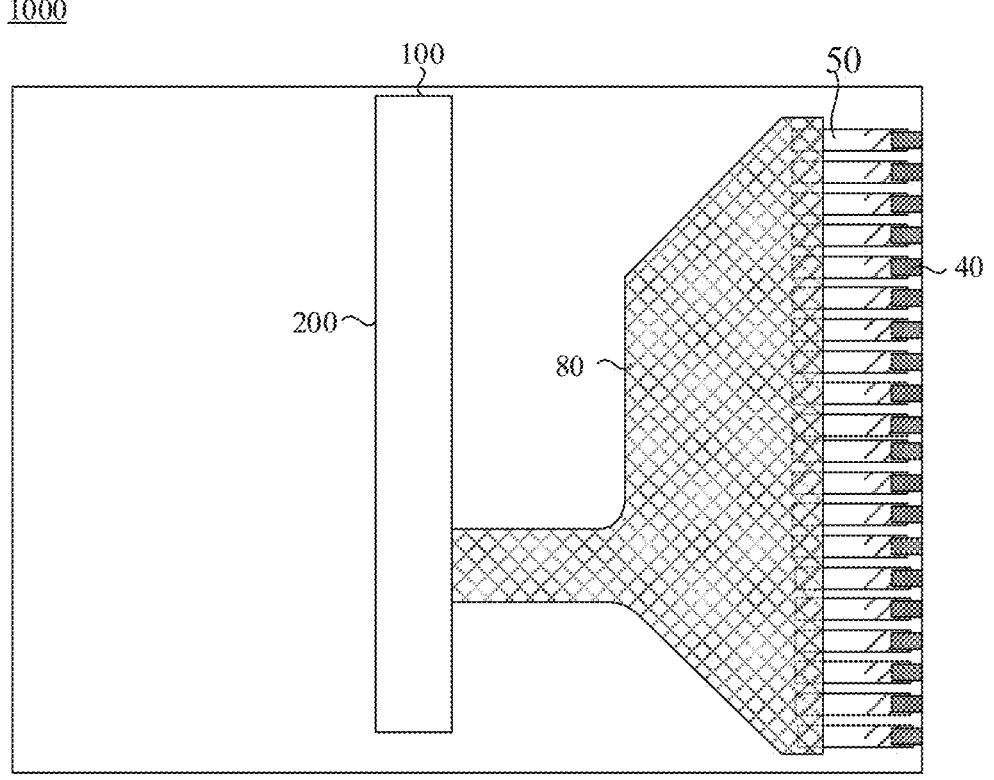
FIG. 2 is a diagram showing structures on a non-display surface of a display panel.

As shown in FIGS. 1 and 2, a structural diagram of a display device 1000 is provided. FIG. 1 is a diagram showing structures on a front surface of the display device 1000, and FIG. 2 is a diagram showing structures on a back surface of the display device 1000. The display device 1000 includes a display panel 100 and a driver circuit board 200. The driver circuit board 200 is configured to drive the display panel 100 to display images, e.g., a driver integrated circuit (IC). The driver circuit board 200 includes, for example, a gate driver circuit, a source driver circuit, a timing controller, and a power circuit. The driver circuit board 200 is electrically connected to the display panel 100, and is configured to output corresponding signals to control the display panel 100 to display images.

Figure 17:
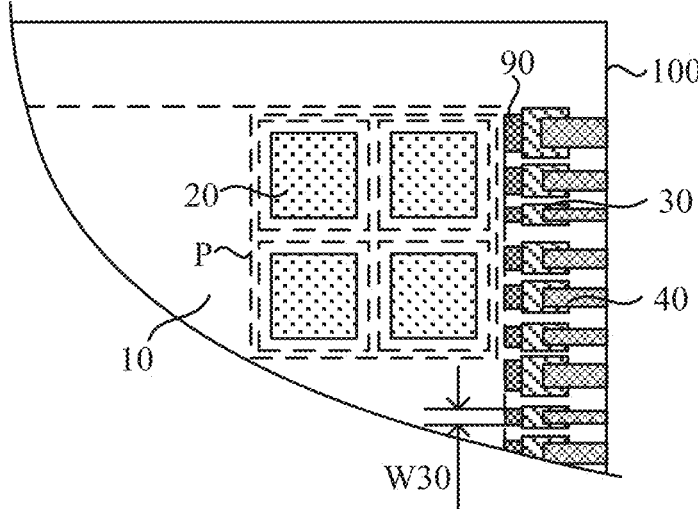
FIG. 17 is a diagram showing partial structures on a non-display surface of a display panel, in accordance with some embodiments of the present disclosure.

As shown in FIG. 1, the display panel 100 includes an active area AA and a peripheral area BB disposed on at least one side of the active area. For example, the peripheral area BB may be located on one side, two sides, or three sides of the active area AA, or the peripheral area BB may be disposed around the active area AA. As shown in FIGS. 1 and 17, a plurality of pixels P arranged in an array and a plurality of signal lines 90 are disposed in the active area AA, and the plurality of signal lines 90 are electrically connected to the plurality of pixels P. Each pixel P includes at least one light-emitting device 20. The light-emitting device 20 may be, for example, an inorganic light-emitting diode. A size of the inorganic light-emitting diode is less than 500 μm or less than 100 μm.

Figure 3:
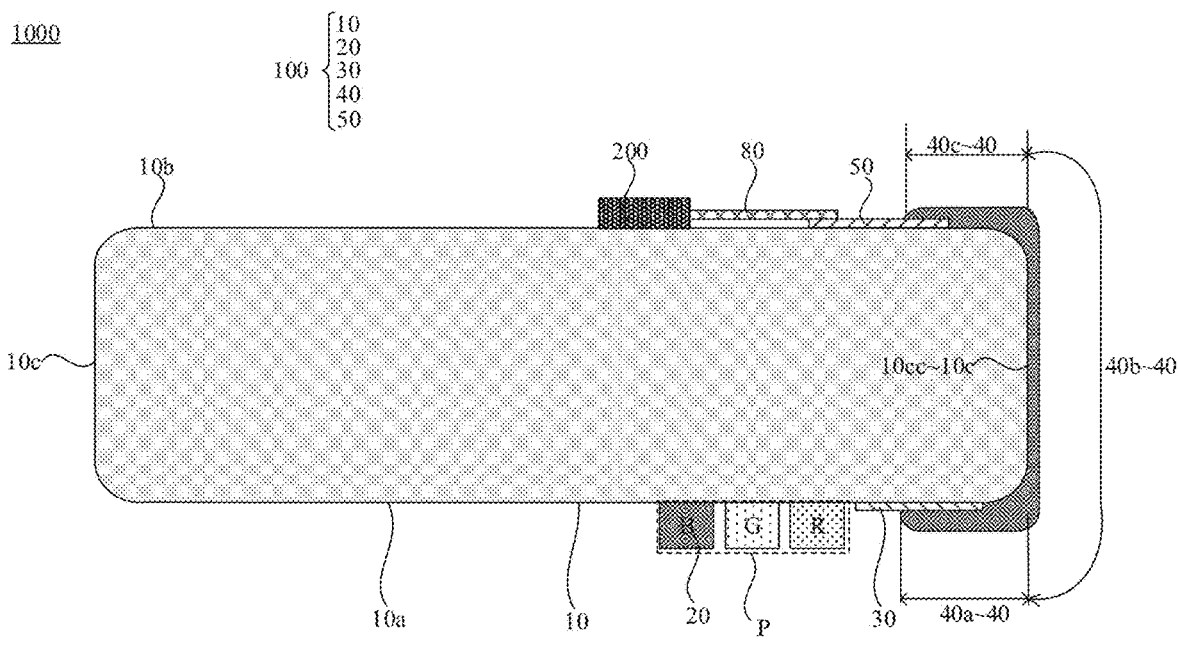
FIG. 3 is a cross-sectional view of a display panel.

FIG. 3 is a cross-sectional view of the display device 1000 shown in FIG. 1. As shown in FIG. 3, the display panel 100 includes a backplane 10, a plurality of light-emitting devices 20, a plurality of first electrodes 30, a plurality of connection traces 40, and a plurality of second electrodes 50. The backplane 10 includes a first surface 10a, a second surface 10b opposite to the first surface 10a, and a plurality of side surfaces 10c connecting the first surface 10a with the second surface 10b. At least one of the plurality of side surfaces is a selected side surface 10cc. The backplane 10 may be a glass substrate. Each connection trace 40 of the plurality of connection traces 40 includes a first trace segment 40a, a second trace segment 40b and a third trace segment 40c that are connected in sequence. The first trace segment 40a is disposed on the first surface 10a, the second trace segment 40b is disposed on the selected side surface 10cc, and the third trace segment 40c is disposed on the second surface 10b. The plurality of first electrodes 30 are disposed on the first surface 10a, and are proximate to the selected side surface 10cc. The first electrode 30 is configured to be electrically connect to a light-emitting-device 20 and the first trace segment 40a. The plurality of second electrodes 50 are disposed on the second surface 10b, and are proximate to the selected side surface 10cc. For example, positions of the plurality of first electrodes 30 correspond to positions of the plurality of second electrodes 50, and the second electrode 50 is configured to be electrically connected to the third trace segment 40c, and electrically connected to a flexible printed circuit (FPC) or the driver circuit board 200. That is, the connection trace 40 connects the first electrode 30 with the second electrode 50 to realize the connection between structures on the first surface 10a and corresponding structures on the second surface 10b of the backplane 10.

It will be understood that, the first surface and the second are parallel to each other. The side surfaces (including the selected side surface) each may be a plane, a curved surface, or a surface formed by a combination of at least one plane and at least one curved surface. For example, a side surface is formed by a plane portion and two curved surface portions, where the plane portion is perpendicular to the plane where the first surface is located, one of the two curved surface portions is used for connecting the plane portion with the first surface, and the other of the two curved surface portions is used for connecting the plane portion with the second surface.

As shown in FIGS. 2 and 3, the driver circuit board 200 is bonded to a non-display surface of the display panel 100, that is, the driver circuit board 200 is bonded to the second surface 10b of the backplane 10. The light-emitting devices 20 located on a display surface (the first surface 10a of the backplane 10) of the display panel 100 are electrically connected to the driver circuit board 200 through the connection traces 40. In this way, it may be possible to reduce a bezel of the display device 1000, and increase a screen-to-body ratio of the display device.

In some examples, the light-emitting device 20 is a mini light-emitting diode (Mini LED) or a micro light-emitting diode (Micro LED). Due to the constraints of the existing process capabilities and cost factors, a large-sized display panel cannot be manufactured directly, and the current solution is to achieve a large-sized display panel in a manner of tiling a plurality of small-sized display panels. As shown in FIG. 3, the driver circuit board 200 of the display device 1000 is bonded to the second surface 10b of the backplane 10. The light-emitting device 20 located on the first surface 10a of the backplane 10 is electrically connected to the driver circuit board 200 located on the second surface 10b through the first trace segment 40a, the second trace segment 40b and the third trace segment 40c. In this way, the bezel width of the display device 1000 is reduced, and the screen-to-body ratio of the display device 1000 is increased, which is beneficial to achieve a seamless tiling effect.

In some examples, the first electrode 30 located on the first surface 10a of the backplane 10 and the second electrode 50 located on the second surface 10b of the backplane 10 are fabricated using processes such as electroplating, evaporation, pad printing silver adhesive, or wet etching. In these processes, after film layers on the first surface 10a of the backplane 10 are all fabricated, it is necessary to turn over the backplane 10, and fabricate corresponding film layers on the second surface 10b. During the actual production process, the backplane 10 needs to be turned over, so that the first surface 10a is inevitably made to be in contact with an equipment base, thus the first surface 10a may be inevitably scratched or dirty. Scratch or dirt may lead to a short circuit or an open circuit, affecting the yield and quality of the products.

In light of this, some embodiments of the present disclosure provide a display panel, a display device, and a tiled display apparatus. The display panel is manufactured using a single sided process with the second electrode removed, and third trace segments disposed on a second surface are electrically connected to the flexible printed circuit. As a result, it is unnecessary to turn over a backplane in the production process, so as to prevent the backplane from being scratched and dirty because of coming into contact with the equipment, thereby improving the yield and quality of the products.

The display panel, the display device, and the tiled display apparatus provided by the present disclosure will be described below.

Figure 4:
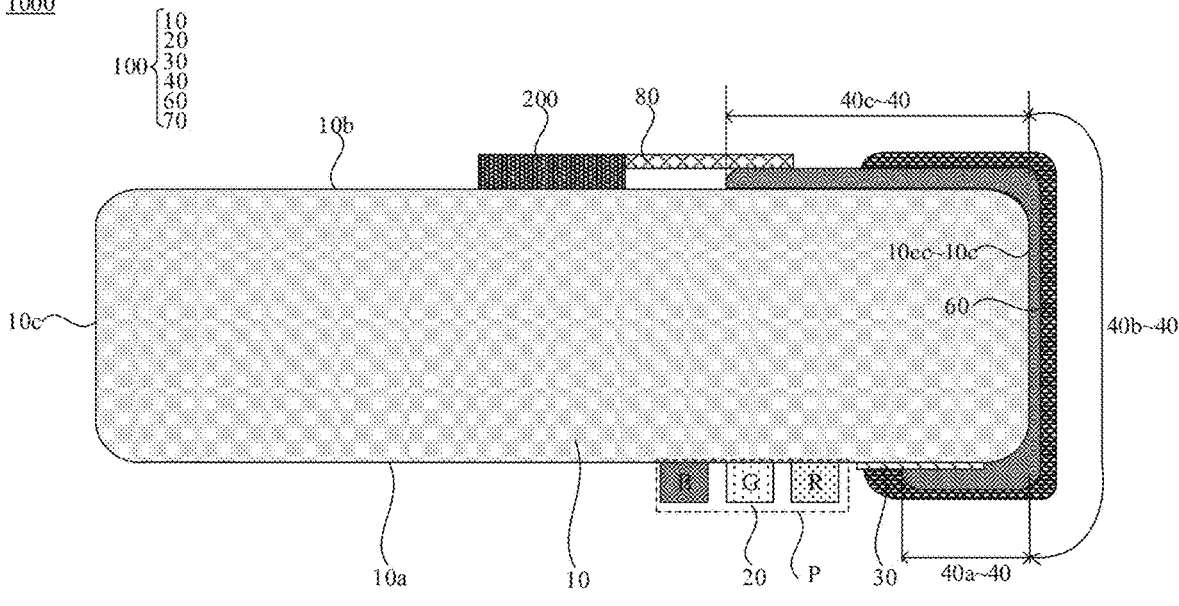
FIG. 4 is a cross-sectional view of another display panel, in accordance with some embodiments of the present disclosure.

In the present disclosure, as shown in FIG. 4, the display panel 100 includes a backplane 10, a plurality of light-emitting devices 20, a plurality of first electrodes 30, and a plurality of connection traces 40. For the arrangements and connection relationships of the plurality of light-emitting devices 20, the plurality of first electrodes 30 and the plurality of connection traces 40, reference may be made to the above description, and the details will not be repeated herein.

Figure 5:
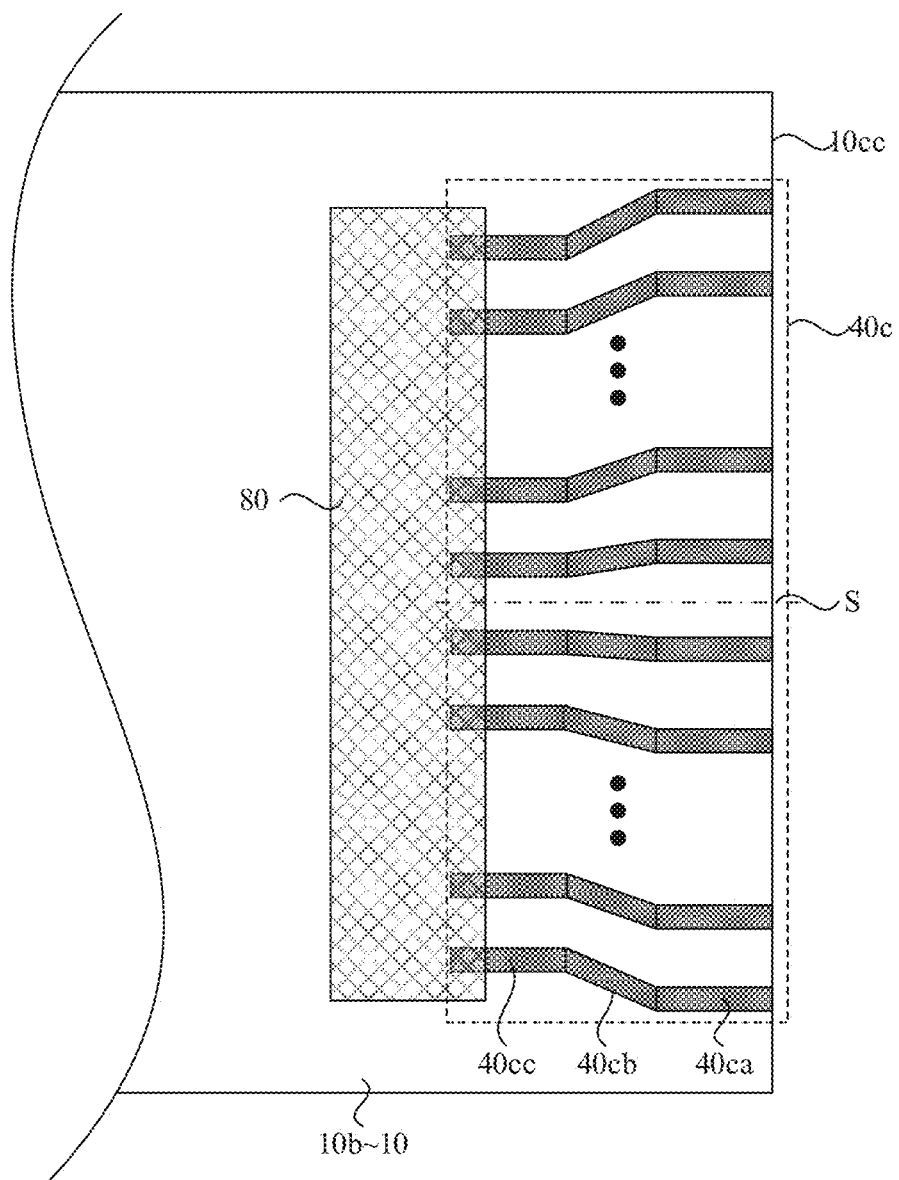
FIG. 5 is a diagram showing partial structures on a non-display surface of another display panel, in accordance with some embodiments of the present disclosure.
Figure 6:
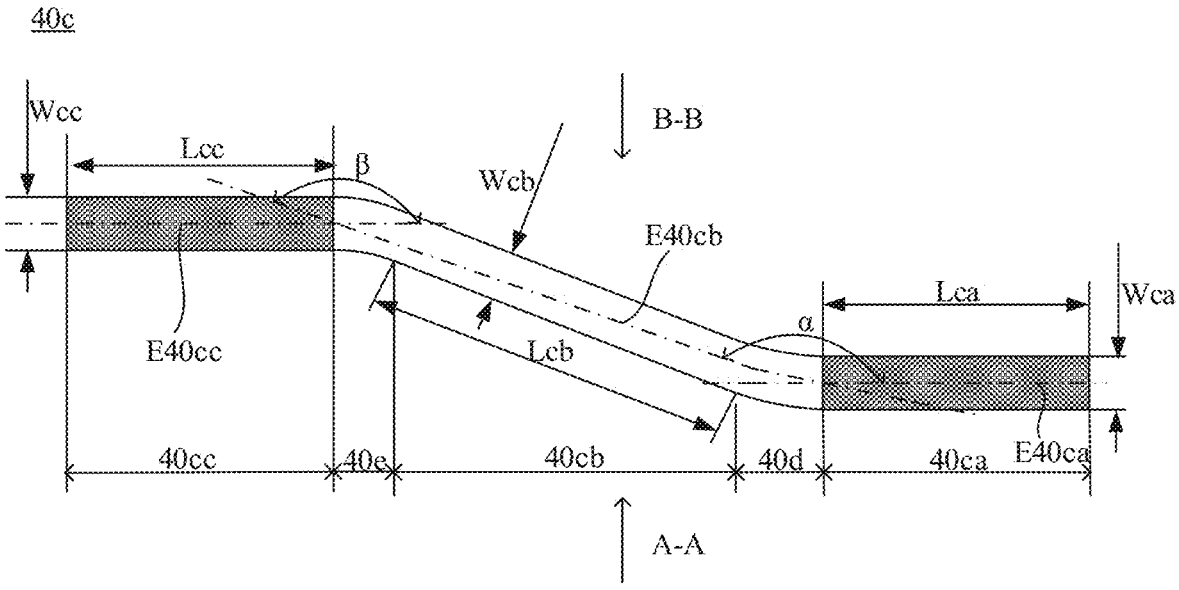
FIG. 6 is a structural diagram of a third trace segment, in accordance with some embodiments of the present disclosure.

As shown in FIG. 5, the third trace segment 40c includes a first sub-segment 40ca, a second sub-segment 40cb and a third sub-segment 40cc that are connected in sequence, where the first sub-segment 40ca is proximate to the selected side surface 10cc. First sub-segments 40ca of the plurality of connection traces 40 are arranged in parallel, and third sub-segments 40cc of the plurality of connection traces 40 are arranged in parallel. As shown in FIG. 6, an extension direction E40ca of the first sub-segment 40ca intersects an extension direction E40cb of the second sub-segment 40cb, and the extension direction E40cb of the second sub-segment 40cb intersects an extension direction E40cc of the third sub-segment 40cc. An angle $\alpha$ formed between the extension direction E40ca of the first sub-segment 40ca and the extension direction E40cb of the second sub-segment 40cb is in a range from 90° to 180°; and an angle $\beta$ formed between the extension direction E40cc of the third sub-segment 40cc and the extension direction E40cb of the second sub-segment 40cb is in a range from 90° to 180°.

In some examples, as shown in FIGS. 5 and 6, the first sub-segment 40ca, the second sub-segment 40cb and the third sub-segment 40cc are all straight line segments. The first sub-segment 40ca and the third sub-segment 40cc are parallel to each other, and both ends of the second sub-segment 40cb are connected to the first sub-segment 40ca and the third sub-segment 40cc. In a case where the first sub-segment 40ca and the third sub-segment 40cc are parallel to each other, and are not in a same straight line, the angle $\alpha$ formed between the extension direction E40ca of the first sub-segment 40ca and the extension direction E40cb of the second sub-segment 40cb satisfies the following condition: greater than 90° and less than 180° ($90° < \alpha < 180°$), and the angle R formed between the extension direction E40cc of the third sub-segment 40cc and the extension direction E40cb of the second sub-segment 40cb satisfies the following condition: greater than 90° and less than 180° ($90° < \beta < 180°$).

In some other examples, the angle $\alpha$ and the angle $\beta$ are set to be in a range from 100° to 180°, the minimum values of the angle $\alpha$ and the angle $\beta$ are 100°. The larger the angle $\alpha$ formed between the extension direction of the first sub-segment 40ca and the extension direction of the second sub-segment 40cb, the smaller a deflection angle of the second sub-segment 40cb relative to the first sub-segment 40ca (a supplementary angle of the angle $\alpha$) and the larger the angle $\beta$ formed between the extension direction of the third sub-segment 40cc and the extension direction of the second sub-segment 40cb, the smaller a deflection angle of the third sub-segment 40cc relative to the second sub-segment 40cb (a supplementary angle of the angle @). In a process of fabricating the third trace segment by using a laser process, by controlling a laser beam to maintain a uniform movement in the production process, it may be possible to avoid a situation that the laser beam stops too long at a certain point and thus radiates excessive energy, which may further avoid that non-target film layers (e.g., conductive film layers located on the first surface of the backplane) are damaged. The laser beam needs to stop at a junction position between two sub-segments, so that a direction in which the laser beam travels is deflected. The smaller the deflection angle of the laser beam (i.e., a deflection angle between two adjacent sub-segments), the shorter the laser beam needs to stop and the less the non-target film layers are damaged. Thus, by setting the range of the angle $\alpha$ and the angle $\beta$, it may be possible to reduce the damage caused by the laser to the non-target film layers, and improve the yield of the display panel.

A portion of the connection trace 40 located on the second surface 10b of the display panel 100 is directly connected to the flexible printed circuit 80. That is, layer structures of the display panel 100 located on the first surface 10*a* may be fabricated first, then the connection trace 40 is fabricated by a side process. Since the connection trace 40 extends to the second surface 10*b* of the backplane 10, it may be possible to avoid damage to the layer structures on the first surface 10*a* when film layers are fabricated on the second surface 10*b*.

In an aspect, the production process is simplified. For example, it may be possible to reduce the number of patterning processes, reduce the number of masks required, omit the steps and materials for replacing scratched protective layers, so as to reduce the manufacturing cost of the products and improve the competitiveness of the products.

In another aspect, the number of times that the backplane 10 comes into contact with the equipment base is reduced, so that it may be possible to avoid a situation that the display panel 100 is unable to operate normally as a part of elements fail due to the breakage of signal lines, thereby improving the yield of the products. In the long run, the backplane 10 may be less dirty due to the reduced number of times that the backplane 10 comes into contact with the equipment base, which may cause the elements or circuits to be corroded, so that it may be possible to prolong the service life of the display panel 100.

In some embodiments, as shown in FIG. 5, a plurality of third trace segments 40*c* are electrically connected to at least one flexible printed circuit 80; and at least two third trace segments 40*c* that are connected to a same flexible printed circuit 80 are symmetrically arranged with respect to a line of symmetry S perpendicular to the selected side surface 10*cc*. At least two third trace segments 40*c* that are connected to a same flexible printed circuit 80 are referred to as a group of third trace segments 40*c*, and the group of third trace segments 40*c* corresponds to a single line of symmetry S. For example, the third trace segments 40*c* in the same group tend to approach the line of symmetry S, developing a trend that the first sub-segment 40*ca* gathers toward the third sub-segment 40*cc*.

Figure 7:
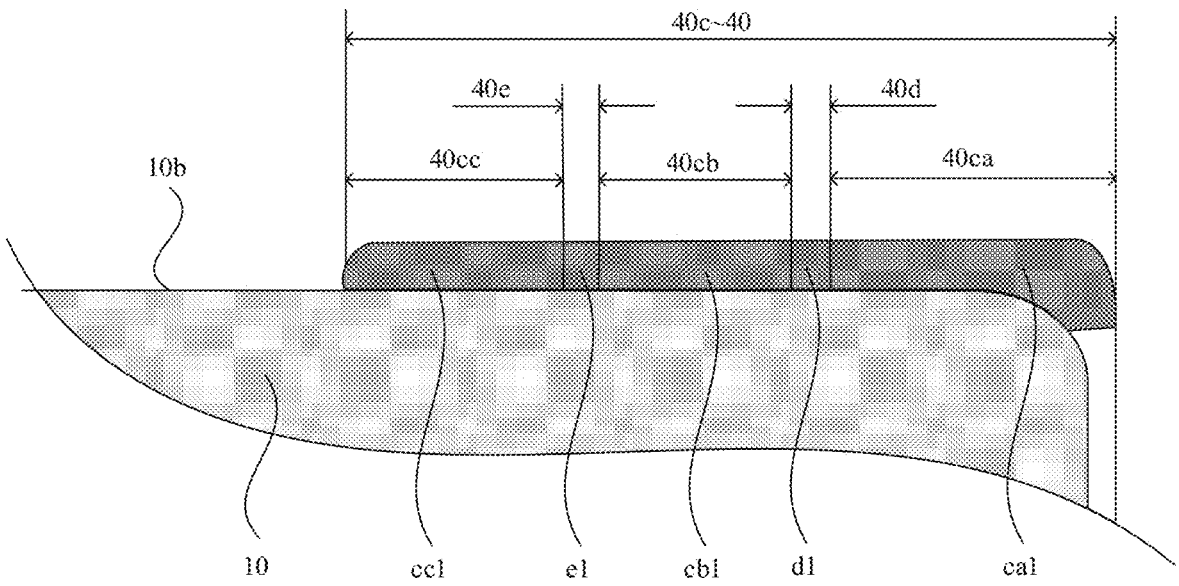
FIG. 7 is a structural diagram of a side surface of the third trace segment along the direction A-A in FIG. 6.
Figure 8:
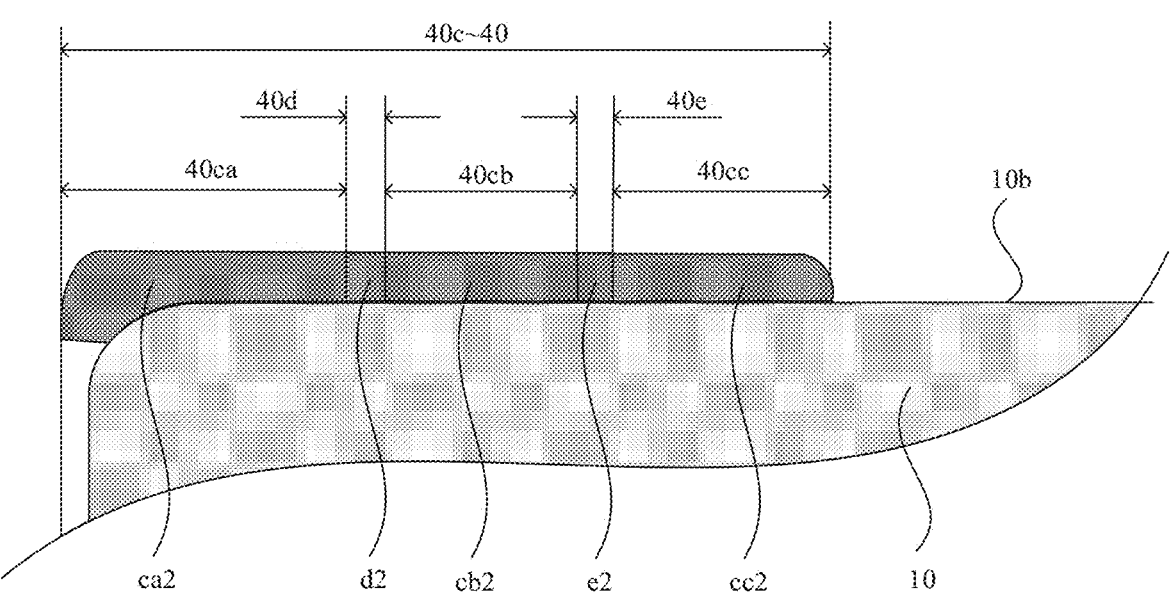
FIG. 8 is a structural diagram of a side surface of the third trace segment along the direction B-B in FIG. 6.
Figure 9:
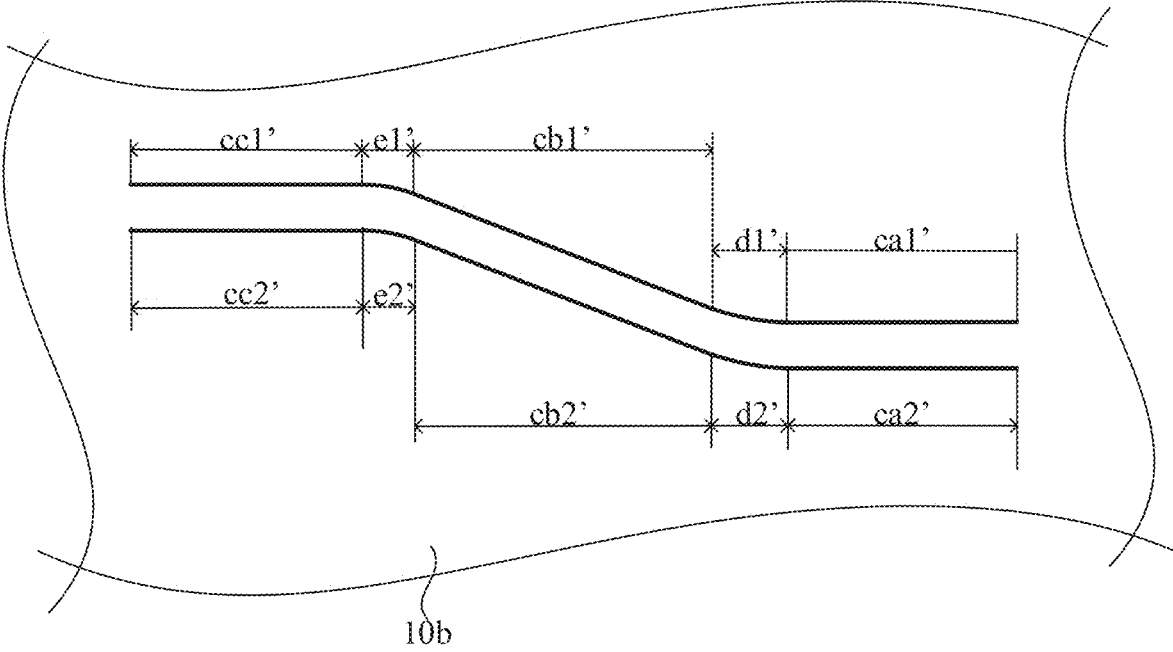
FIG. 9 is a diagram showing orthographic projections of side surfaces of a third trace segment on a backplane, in accordance with some embodiments of the present disclosure.

FIG. 6 is a structural diagram of the third trace segment 40*c*. In some embodiments, as shown in FIG. 6, the connection trace 40 further includes a first connection portion 40*d*, the first sub-segment 40*ca* is connected to the second sub-segment 40*cb* through the first connection portion 40*d*. FIG. 7 is a structural diagram of the third trace segment 40*c* along the direction A-A in FIG. 6, FIG. 8 is a structural diagram of the third trace segment 40*c* along the direction B-B in FIG. 6, and FIG. 9 is a diagram showing orthographic projections of two opposite side surfaces of the third trace segment 40*c* on the backplane 10. As shown in FIGS. 7, 8 and 9, the first connection portion 40*d* includes a first inner side surface d1 and a first outer side surface d2 that are opposite to each other. In the first connection portion 40*d*, the first inner side surface d1 is closer to a line of symmetry S with respect to the first connection portion 40*d* than the first outer side surface d2. An orthographic projection of the first inner side surface d1 on the backplane 10 is a first inner edge d1', and an orthographic projection of the first outer side surface d2 on the backplane 10 is a first outer edge d2.

As shown in FIGS. 7, 8 and 9, the first sub-segment 40*ca* includes an inner side surface ca1 of the first sub-segment and an outer side surface ca2 of the first sub-segment that are opposite to each other. In the first sub-segment 40*ca*, the inner side surface ca1 is closer to a line of symmetry S with respect to the first sub-segment 40*ca* (the line of symmetry S corresponding to a group of third trace segments 40*c* including the first sub-segment 40*ca*) than the outer side surface ca2. An orthographic projection of the inner side surface ca1 of the first sub-segment on the backplane 10 is an inner edge ca1' of the first sub-segment, and an orthographic projection of the outer side surface ca2 of the first sub-segment on the backplane 10 is an outer edge ca2' of the first sub-segment. The second sub-segment 40*cb* includes an inner side surface cb1 of the second sub-segment and an outer side surface cb2 of the second sub-segment. In the second sub-segment 40*cb*, the inner side surface cb1 is closer to a line of symmetry S with respect to the second sub-segment 40*cb* (the line of symmetry S corresponding to a group of third trace segments 40*c* including the second sub-segment 40*cb*) than the outer side surface cb2. An orthographic projection of the inner side surface cb1 of the second sub-segment on the backplane 10 is an inner edge cb1' of the second sub-segment, and an orthographic projection of the outer side surface cb2 of the second sub-segment on the backplane 10 is an outer edge cb2' of the second sub-segment. As shown in FIG. 9, the first inner edge d1' is connected to the inner edge ca1' of the first sub-segment and the inner edge cb1' of the second sub-segment, and the first outer edge d2' is connected to the outer edge ca2' of the first sub-segment and the outer edge cb2' of the second sub-segment.

In some examples, as shown in FIG. 6, for the connection trace 40, the angle α formed between the extension direction E40*ca* of the first sub-segment 40*ca* and the extension direction E40*cb* of the second sub-segment 40*cb* is in a range from 100° to 180°. That is, the angle α satisfies the following condition: equal to 100° or greater than 100°, and less than 180° (100°≤α<180°). For example, the angle α is 100°, 150°, or 170°. The first sub-segment 40*ca* is connected to the second sub-segment 40*cb* through the first connection portion 40*d*. The first connection portion 40*d*, the first sub-segment 40*ca* and the second sub-segment 40*cb* each belong to the connection trace 40, and the first sub-segment 40*ca*, the first connection portion 40*d* and the second sub-segment 40*cb* are connected in sequence and formed as a whole.

Figure 10:
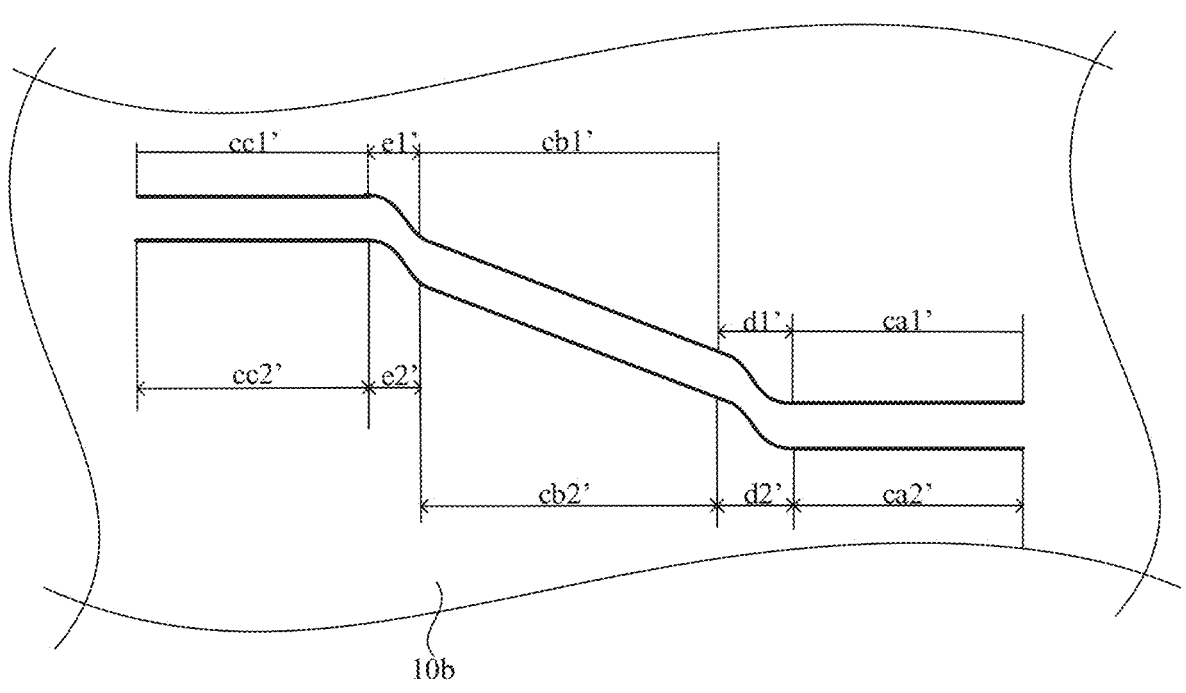
FIG. 10 is a diagram showing orthographic projections of side surfaces of another third trace segment on a backplane, in accordance with some embodiments of the present disclosure.

In some embodiments, as shown in FIGS. 9 and 10, the first inner edge d1' is a curve, and/or the first outer edge d2' is a curve.

In some examples, as shown in FIG. 9, the first inner edge d1' is an arc, and/or the first outer edge d2' is an arc. For example, the first inner edge d1' and the first outer edge d2' that are opposite to each other are both arcs. The first inner edge d1' is tangent to the inner edge ca1' of the first sub-segment, and the first inner edge d1' is connected to the inner edge cb1' of the second sub-segment. The first outer edge d2' is tangent to the outer edge ca2' of the first sub-segment, and the first outer edge d2' is connected to the outer edge cb2' of the second sub-segment.

In some other examples, as shown in FIG. 10, the first inner edge d1' is an S-shaped curve, and/or the first outer edge d2' is an S-shaped curve. For example, the first inner edge d1' and the first outer edge d2' that are opposite to each other are both S-shaped curves. The first inner edge d1' is smoothly connected to the inner edge ca1' of the first sub-segment, and the first inner edge d1' is smoothly connected to the inner edge cb1' of the second sub-segment. The first outer edge d2' is smoothly connected to the outer edge ca2' of the first sub-segment, and the first outer edge d2' is smoothly connected to the outer edge cb2' of the second sub-segment.

For example, a metal coating is fabricated on the first surface, the selected side surface and the second surface 10*b* of the backplane, and the metal coating is etched using a laser to make the metal coating have a pattern, so as to obtain the plurality of connection traces. In the laser etching process, it is critical to ensure that the non-target film layers are not damaged in the entire process. For example, in a process of forming the third trace segment of the connection trace, a portion of the metal coating located on the second surface $10b$ of the backplane is etched using a laser, the laser energy may penetrate the backplane and damage the film layers located on the first surface of the backplane, thereby causing problems such as broken circuit. Whether the non-target film layers are damaged or not is directly related to the absorption of the laser by a material of the non-target film layers, the laser energy, a duration in which the laser stops on the metal coating, and the like.

By controlling the laser beam to maintain a uniform movement in the production process, it may be possible to avoid the situation that the laser beam stops too long at a certain point, thus the non-target film layers are damaged. In a process of forming the first sub-segment $40ca$ and the second sub-segment $40cb$, the laser beam may be controlled to perform etching at a constant speed along a path that is parallel to the extension direction of the first sub-segment $40ca$. However, the first sub-segment $40ca$ and the second sub-segment $40cb$ have the angle therebetween, and the angle is in the range from 100° to 180°, that is, a direction in which the laser beam travels may be deflected, and the laser beam needs to stop at the junction position between the two sub-segments to adjust the direction. Therefore, in order to ensure the uniform movement of the laser beam in the entire process, the laser beam needs to be controlled to travel along a path of a smooth curve at an end of the first sub-segment $40ca$ closest to the second sub-segment $40cb$, so that the laser beam may be gradually controlled to travel in a direction parallel to the extension direction of the second sub-segment $40cb$.

Figure 11:
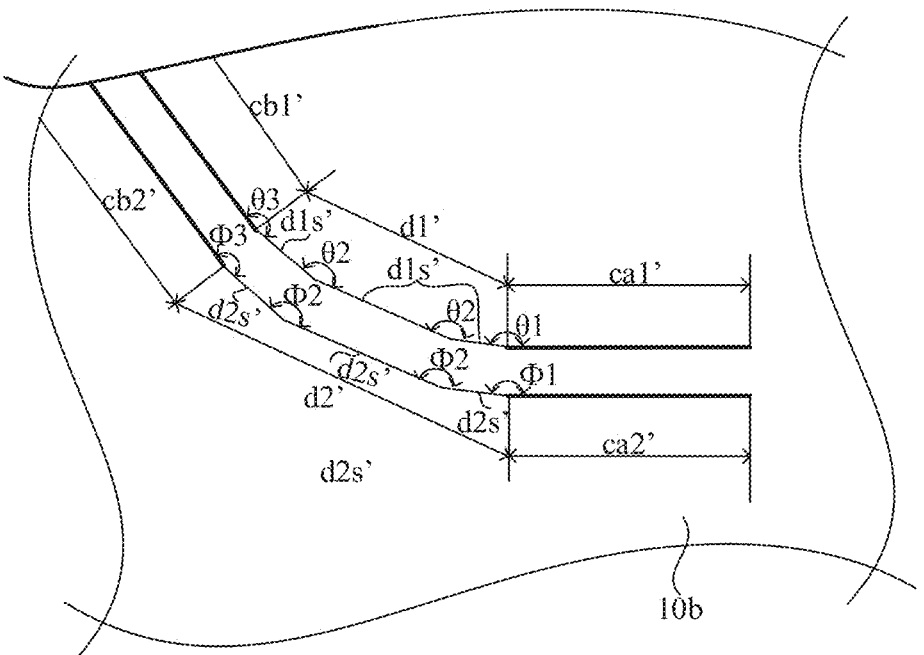
FIG. 11 is a diagram showing orthographic projections of side surfaces of a first connection portion of yet another third trace segment on a backplane, in accordance with some embodiments of the present disclosure.

In some embodiments, as shown in FIG. 11, the first inner edge d1' includes a plurality of broken line segments d1s' that are connected in sequence end-to-end. An angle $\theta1$ formed between a broken line segment d1s', in the plurality of broken line segments dis' of the first inner edge d1', connected to the inner edge ca1' of the first sub-segment and the inner edge ca1' of the first sub-segment is in a range from 170° to 177°. An angle $\theta2$ formed between two broken line segments dis' that are connected to each other in the plurality of broken line segments d1s' of the first inner edge d1' is in a range from 170° to 177°. An angle $\beta$ formed between a broken line segment d1s', in the plurality of broken line segments d1s' of the first inner edge d1', connected to the inner edge cb1' of the second sub-segment and the inner edge cb1' of the second sub-segment is in a range from 170° to 177°.

In some examples, the angle $\theta1$ formed between the broken line segment, in the plurality of broken line segments of the first inner edge d1', connected to the inner edge ca1' of the first sub-segment and the inner edge ca1' of the first sub-segment is 170°, 175°, or 177°; the angle $\theta2$ formed between the two broken line segments that are connected to each other in the plurality of broken line segments of the first inner edge d1' is 170°, 175°, or 177°; the angle $\theta3$ formed between the broken line segment, in the plurality of broken line segments of the first inner edge d1', connected to the inner edge cb1' of the second sub-segment and the inner edge cb1' of the second sub-segment is 170°, 175°, or 177°. Considering an example in which the angle $\theta1$, the angle $\theta2$ and the angle $\theta3$ are all 170°, and the angle $\alpha$ formed between the inner edge ca1' of the first sub-segment and the inner edge cb1' of the second sub-segment is 150°, that is, the inner edge cb1' of the second sub-segment is deflected by 30° relative to the inner edge ca1' of the first sub-segment. The plurality of broken line segments of the first inner edge d1' are deflected for multiple times, and each broken line segment is deflected by 10° once. The first inner edge d1' serves as a relatively smooth transition between the inner edge ca1' of the first sub-segment and the inner edge cb1' of the second sub-segment, accordingly, the first inner side surface d1 serves as a relatively smooth transition between the inner side surface ca1 of the first sub-segment and the inner side surface cb1 of the second sub-segment.

In some other embodiments, as shown in FIG. 11, the first outer edge d2' includes a plurality of broken line segments d2s' that are connected in sequence end-to-end. An angle $\Phi1$ formed between a broken line segment d2s', in the plurality of broken line segments d2s' of the first outer edge d2', connected to the outer edge ca2' of the first sub-segment and the outer edge ca2' of the first sub-segment is in a range from 170° to 177°. An angle $\Phi2$ formed between two broken line segments d2s' that are connected to each other in the plurality of broken line segments d2s' of the first outer edge d2' is in a range from 170° to 177°. An angle $\Phi3$ formed between a broken line segment d2s', in the plurality of broken line segments d2s' of the first outer edge d2', connected to the outer edge cb2' of the second sub-segment and the outer edge cb2' of the second sub-segment is in a range from 170° to 177°.

In some examples, the angle $\Phi1$ formed between the broken line segment, in the plurality of broken line segments of the first outer edge d2', connected to the outer edge ca2' of the first sub-segment and the outer edge ca2' of the first sub-segment is 170°, 175°, or 177°; the angle $\Phi2$ formed between the two broken line segments that are connected to each other in the plurality of broken line segments of the first outer edge d2' is 170°, 175°, or 177°; the angle $\Phi3$ formed between the broken line segment, in the plurality of broken line segments of the first outer edge d2', connected to the outer edge cb2' of the second sub-segment and the outer edge cb2' of the second sub-segment is 170°, 175°, or 177°. Considering an example in which the angle $\Phi1$, the angle $\Phi2$ and the angle $\Phi3$ are all 170°, and the angle $\alpha$ formed between the outer edge ca2' of the first sub-segment and the outer edge cb2' of the second sub-segment is 150°, that is, the outer edge cb2' of the second sub-segment is deflected by 30° relative to the outer edge ca2' of the first sub-segment, and the plurality of broken line segments of the first outer edge d2' are deflected for multiple times, and each broken line segment is deflected by 10° once. The first outer edge d2' serves as a relatively smooth transition between the outer edge ca2' of the first sub-segment and the outer edge cb2' of the second sub-segment, accordingly, the first outer side surface d2 serves as a relatively smooth transition between the outer side surface ca2 of the first sub-segment and the outer side surface cb2 of the second sub-segment.

In combination with the above examples, the first sub-segment $40ca$ is connected to the second sub-segment $40cb$ through the first connection portion $40d$. The first inner edge d1' of the first connection portion $40d$ is deflected by 3° to 10° for multiple times through the plurality of broken line segments thereof, so as to achieve a deflection of 0° to 80° between the inner edge ca1' of the first sub-segment and the inner edge cb1' of the second sub-segment. The first inner side surface d1 serves as the relatively smooth transition between the inner side surface ca1 of the first sub-segment and the inner side surface cb1 of the second sub-segment.

The first outer edge d2' of the first connection portion $40d$ is deflected by 3° to 10° for multiple times through the plurality of broken line segments thereof, so as to achieve a deflection angle between the outer edge ca2' of the first sub-segment and the outer edge cb2' of the second sub-segment, i.e., the supplementary angle of the angle α. The supplementary angle of the angle α is in a range from 0° to 80°, that is, the direction in which the laser beam travels will be deflected by 0° to 80°. The first outer side surface d2 serves as the relatively smooth transition between the outer side surface ca2 of the first sub-segment and the outer side surface cb2 of the second sub-segment.

On the basis that the first inner side surface d1 and the first outer side surface d2 serve as the relatively smooth transitions, the first connection portion 40d serves as a transition between the first sub-segment 40ca and the second sub-segment 40cb. In this way, on the basis that a deflection of 0° to 80° between the first sub-segment 40ca and the second sub-segment 40cb is satisfied, the first sub-segment 40ca and the second sub-segment 40cb achieve a relatively smooth transition connection therebetween.

During the actual production process, it may not be possible to control the laser to travel along a path of a perfect arc or a smooth curve. In a case where the first inner edge d1' and the first outer edge d2' each adopt the plurality of broken line segments, and a deflection angle between two adjacent broken line segments is very small, a path in which the laser travels has a plurality of broken line segments, which is consistent with the first inner edge d1' or the first outer edge d2'. In addition, the deflection angle is very small at the deflection position of two adjacent broken line segments. For example, the deflection angle is in a range from 3° to 10°, the laser stops for a relatively short time due to adjustment of the direction in which the laser travels, thus no damage will be caused to the non-target film layers, or the damage caused to the non-target film layers is within an acceptable range.

In some embodiments, as shown in FIG. 6, the connection trace 40 further includes a second connection portion 40e, and the third sub-segment 40cc is connected to the second sub-segment 40cb through the second connection portion 40e. As shown in FIGS. 7, 8 and 9, the second connection portion 40e includes a second inner side surface e1 and a second outer side surface e2 that are opposite to each other. In the second connection portion 40e, the second inner side surface e1 is closer to a line of symmetry S with respect to the second connection portion 40e (the line of symmetry S corresponding to a group of third trace segments 40c including the second connection portion 40e) than the second outer side surface e2. An orthographic projection of the second inner side surface e1 on the backplane 10 is a second inner edge e1', and an orthographic projection of the second outer side surface e2 on the backplane 10 is a second outer edge e2'. The third sub-segment 40cc includes an inner side surface cc1 of the third sub-segment and an outer side surface cc2 of the third sub-segment that are opposite to each other. In the third sub-segment 40cc, the inner side surface cc1 is closer to a line of symmetry S with respect to the third sub-segment 40cc (the line of symmetry S corresponding to a group of third trace segments 40c including the third sub-segment 40cc) than the outer side surface cc2. An orthographic projection of the inner side surface cc1 of the third sub-segment on the backplane 10 is an inner edge cc1' of the third sub-segment, and an orthographic projection of the outer side surface cc2 of the third sub-segment on the backplane 10 is an outer edge cc2' of the third sub-segment. As shown in FIG. 9, the second inner edge e1' is connected to the inner edge cc1' of the third sub-segment and the inner edge cb1' of the second sub-segment, and the second outer edge e2' is connected to the outer edge cc2' of the third sub-segment and the outer edge cb2' of the second sub-segment.

In some examples, as shown in FIG. 6, the angle β formed between the extension direction E40cc of the third sub-segment 40cc and the extension direction E40cb of the second sub-segment 40cb satisfies the following condition: equal to 100° or greater than 100°, and less than 180° (100°≤β<180°). For example, the angle β is 100°, 150°, or 170°. For example, the angle R formed between the extension direction of the third sub-segment 40cc and the extension direction of the second sub-segment 40cb is 150°. The third sub-segment 40cc is connected to the second sub-segment 40cb through the second connection portion 40e. The second connection portion 40e, the third sub-segment 40cc and the second sub-segment 40cb each belong to the connection trace 40, and the third sub-segment 40cc, the second connection portion 40e and the second sub-segment 40cb are connected in sequence and are formed as a whole.

In some embodiments, as shown in FIGS. 9 and 10, the second inner edge e1' is a curve, and/or the second outer edge e2' is a curve.

In some examples, as shown in FIG. 9, the second inner edge e1' is an arc, and/or the second outer edge e2' is an arc. The second inner edge e1' is tangent to the inner edge cc1' of the third sub-segment, and the second inner edge e1' is connected to the inner edge cb1' of the second sub-segment. The second outer edge e2' is tangent to the outer edge cc2' of the third sub-segment, and the second outer edge e2' is connected to the outer edge cb2' of the second sub-segment.

In some other examples, as shown in FIG. 10, the second inner edge e1' is an S-shaped curve, and/or the second outer edge e2' is an S-shaped curve. The second inner edge e1' is smoothly connected to the inner edge cc1' of the third sub-segment, and the second inner edge e1' is smoothly connected to the inner edge cb1' of the second sub-segment. The second outer edge e2' is smoothly connected to the outer edge cc2' of the third sub-segment, and the second outer edge e2' is smoothly connected to the outer edge cb2' of the second sub-segment.

The second inner edge e1' and the second outer edge e2' of the second connection portion 40e are arcs or smooth curves. During the laser etching process, the laser is maintained a uniform movement in a process of processing the second connection portion 40e, thus it may be possible to avoid a situation that the laser stops for a long time at a certain point, and the non-target film layers are damaged. In a process of forming the second sub-segment 40cb and the third sub-segment 40cc, the laser beam may be controlled to perform etching at a constant speed along a path that is parallel to the extension direction of the second sub-segment 40cb. However, a deflection angle of the third sub-segment 40cc with respect to the second sub-segment 40cb is the supplementary angle of the angle 3, and the supplementary angle of the angle R is in a range from 0° to 80°. That is, the direction in which the laser beam travels will be deflected by 0° to 80°, and the laser beam needs to stop at the junction position between the two sub-segments to adjust the direction in which the laser beam travels. Therefore, in order to ensure the uniform movement of the laser beam in the entire process, the laser beam needs to be controlled to travel along a path of a smooth curve at an end of the second sub-segment 40cb closest to the third sub-segment 40cc, so that the laser beam may be gradually controlled to travel in a direction parallel to the extension direction of the third sub-segment 40cc.

Figure 12:
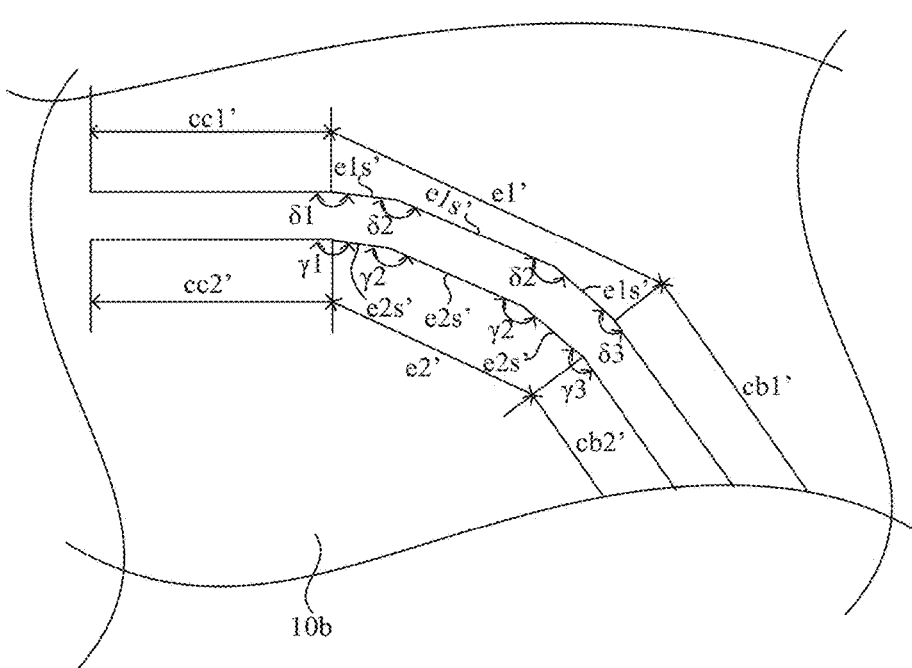
FIG. 12 is a diagram showing orthographic projections of side surfaces of a second connection portion of yet another third trace segment on a backplane, in accordance with some embodiments of the present disclosure.

In some embodiments, as shown in FIG. 12, the second inner edge e1' includes a plurality of broken line segments e1s' that are connected in sequence end-to-end. An angle δ1 formed between a broken line segment e1s', in the plurality of broken line segments e1s' of the second inner edge e1', connected to the inner edge cc1' of the third sub-segment and the inner edge cc1' of the third sub-segment is in a range from 170° to 177°. An angle δ2 formed between two broken line segments e1s' that are connected to each other in the plurality of broken line segments e1s' of the second inner edge e1' is in a range from 170° to 177°. An angle δ3 formed between a broken line segment e1s', in the plurality of broken line segments e1s' of the second inner edge e1', connected to the inner edge cb1' of the second sub-segment and the inner edge cb1' of the second sub-segment is in a range from 170° to 177°.

In some examples, the angle δ1 formed between the broken line segment, in the plurality of broken line segments of the second inner edge e1', connected to the inner edge cc1' of the third sub-segment and the inner edge cc1' of the third sub-segment is 170°, 175°, or 177°. The angle δ2 formed between the two broken line segments that are connected to each other in the plurality of broken line segments of the second inner edge e1' is 170°, 175°, or 177°. The angle δ3 formed between the broken line segment, in the plurality of broken line segments of the second inner edge e1', connected to the inner edge cb1' of the second sub-segment and the inner edge cb1' of the second sub-segment is 170°, 175°, or 177°. Considering an example in which the angle δ1, the angle δ2, and the angle δ3 are all 170°, and the angle β formed between the inner edge cc1' of the third sub-segment and the inner edge cb1' of the second sub-segment is 150°, that is, the inner edge cc1' of the third sub-segment is deflected by 30° relative to the inner edge cb1' of the second sub-segment. The plurality of broken line segments of the second inner edge e1' are deflected for multiple times, and each broken line segment is deflected by 10° once. The second inner edge e1' serves as a relatively smooth transition between the inner edge cc1' of the third sub-segment and the inner edge cb1' of the second sub-segment. Accordingly, the second inner side surface e1 serves as a relatively smooth transition between the inner side surface cc1 of the third sub-segment and the inner side surface cb1 of the second sub-segment.

In some other embodiments, as shown in FIG. 12, the second outer edge e2' includes a plurality of broken line segments e2s' that are connected in sequence end-to-end. An angle γ1 formed between a broken line segment e2s', in the plurality of broken line segments e2s' of the second outer edge e2', connected to the outer edge cc2' of the third sub-segment and the outer edge cc2' of the third sub-segment is in a range from 170° to 177°. An angle γ2 formed between two broken line segments e2s' that are connected to each other in the plurality of broken line segments e2s' of the second outer edge e2' is in a range from 170° to 177°. An angle γ3 formed between a broken line segment e2s', in the plurality of broken line segments e2s' of the second outer edge e2', connected to the outer edge cb2' of the second sub-segment and the outer edge cb2' of the second sub-segment is in a range from 170° to 177°.

In some examples, the angle γ1 formed between the broken line segment, in the plurality of broken line segments of the second outer edge e2', connected to the outer edge cc2' of the third sub-segment and the outer edge cc2' of the third sub-segment is 170°, 175°, or 177°. The angle γ2 formed between the two broken line segments that are connected to each other in the plurality of broken line segments of the second outer edge e2' is 170°, 175°, or 177°. The angle γ3 formed between the broken line segment, in the plurality of broken line segments of the second outer edge e2', connected to the outer edge cb2' of the second sub-segment and the outer edge cb2' of the second sub-segment is 170°, 175°, or 177°. Considering an example in which the angle γ1, the angle γ2, and the angle γ3 are all 170°, and the angle β formed between the outer edge cc2' of the third sub-segment and the outer edge cb2' of the second sub-segment is 150°, that is, the outer edge cc2' of the third sub-segment is deflected by 30° relative to the outer edge cb2' of the second sub-segment. The plurality of broken line segments of the second outer edge e2' are deflected for multiple times, and each broken line segment is deflected by 10° once. The second outer edge e2' serves as a relatively smooth transition between the outer edge cc2' of the third sub-segment and the outer edge cb2' of the second sub-segment. Accordingly, the second outer side surface e2 serves as a relatively smooth transition between the outer side surface cc2 of the third sub-segment and the outer side surface cb2 of the second sub-segment.

In combination with the above examples, the third sub-segment 40cc is connected to the second sub-segment 40cb through the second connection portion 40e. The second inner edge e1' of the second connection portion 40e is deflected by 3° to 10° for multiple times through the plurality of broken line segments thereof, so as to achieve a deflection of 0° to 80° between the inner edge cc1' of the third sub-segment and the inner edge cb1' of the second sub-segment. The second inner side surface e1 serves as the relatively smooth transition between the inner side surface cc1 of the third sub-segment and the inner side surface cb1 of the second sub-segment.

The second outer edge e2' of the second connection portion 40e is deflected by 3° to 10° for multiple times, so as to achieve a deflection of 0° to 80° between the outer edge cc2' of the third sub-segment and the outer edge cb2' of the second sub-segment. The second outer side surface e2 serves as the relatively smooth transition between the outer side surface cc2 of the third sub-segment and the outer side surface cb2 of the second sub-segment.

On the basis that the second inner side surface e1 and the second outer side surface e2 serve as the relatively smooth transitions, the second connection portion 40e serves as a transition between the third sub-segment 40cc and the second sub-segment 40cb. In this way, on the basis that a deflection of 0° to 80° between the third sub-segment 40cc and the second sub-segment 40cb is satisfied, the third sub-segment 40cc and the second sub-segment 40cb achieve a relatively smooth transition connection therebetween.

The second inner edge e1' and the second outer edge e2' of the second connection portion 40e each adopt the plurality of broken line segments, and a deflection angle between two adjacent broken line segments is very small, a path in which the laser travels has a plurality of broken line segments, which is consistent with the second inner edge e1' or the second outer edge d2'. In addition, the deflection angle is very small at the deflection position of two adjacent broken line segments. For example, the deflection angle is in a range from 3° to 10°, the laser stops for a relatively short time due to adjustment of the direction in which the laser travels, thus no damage will be caused to the non-target film layers, or the damage caused to the non-target film layers is within an acceptable range.

As shown in FIGS. 13, 14, 15, and 16, a junction between the second surface 10b and each side surface 10c of the plurality of side surfaces 10c forms an edge-side Ae. That is, there are a plurality of edge-sides Ae, and each edge of the second surface 10$b$ is provided with an edge-side Ae. A junction between the second surface 10$b$ and the selected side surface 10$cc$ forms a selected edge-side Ae', and two edge-sides Ae that are adjacent to the selected edge-side Ae' are a first edge-side Ae1 and a second edge-side Ae2.

Figure 13:
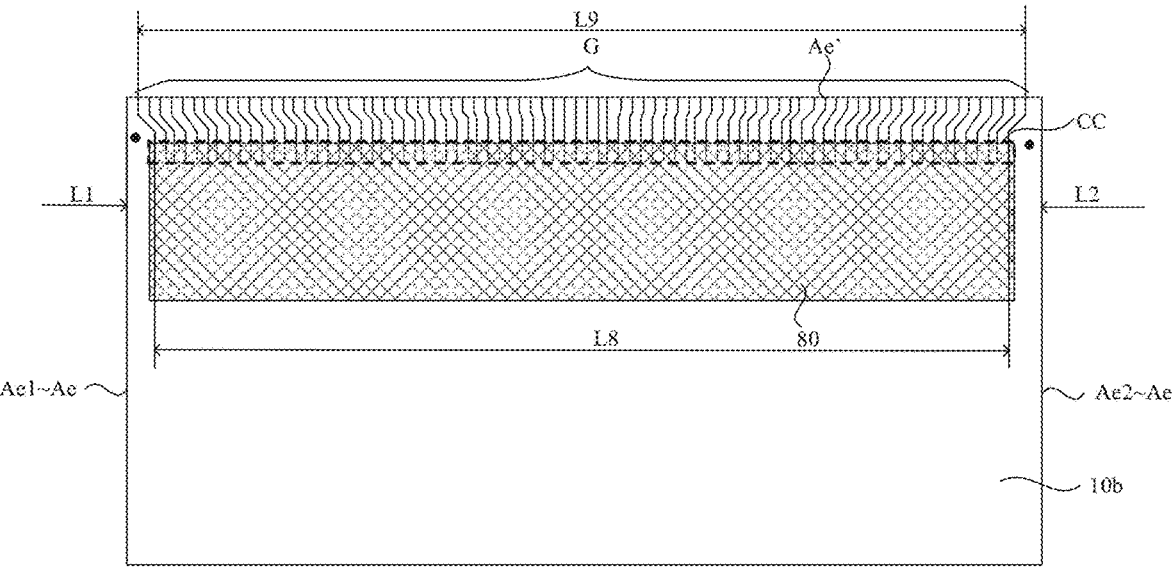
FIG. 13 is a diagram showing structures on a non-display surface of another display panel, in accordance with some embodiments of the present disclosure.
Figure 14:
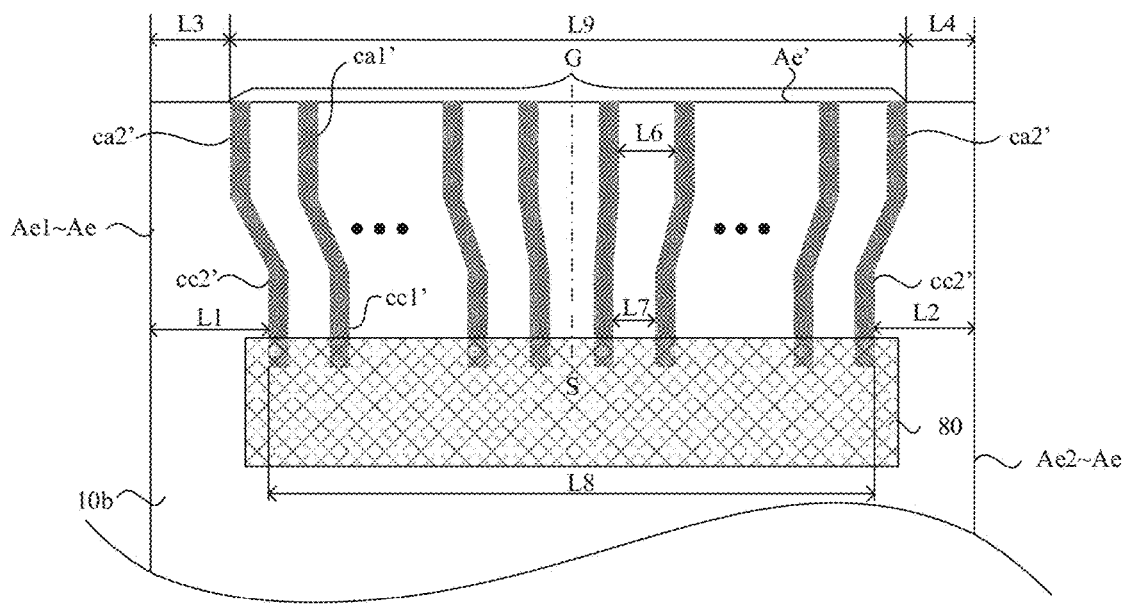
FIG. 14 is an enlarged view of a third trace segment on the non-display surface of the display panel in FIG. 13.
Figure 15:
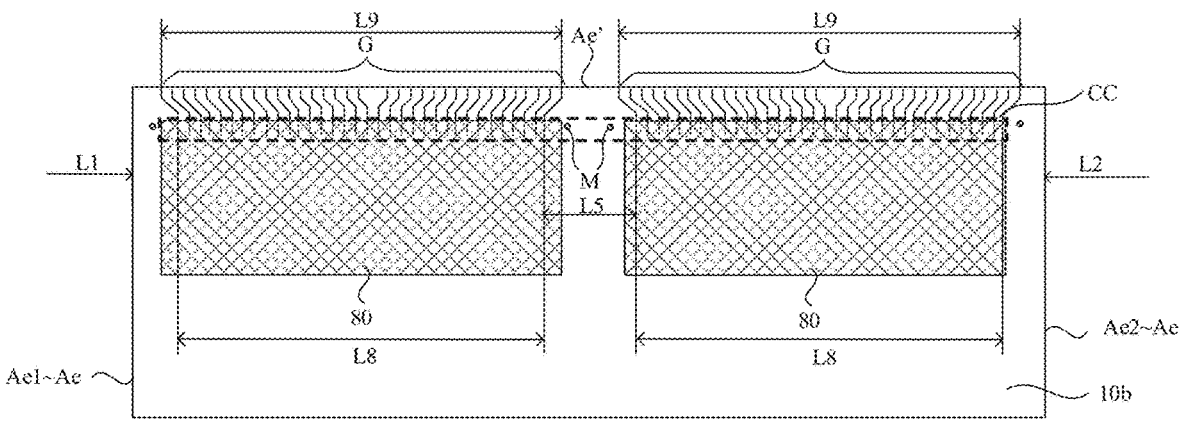
FIG. 15 is a diagram showing structures on a non-display surface of yet another display panel, in accordance with some embodiments of the present disclosure.

In some embodiments, as shown in FIG. 13, the second surface 10$b$ includes a bonding area CC, and the third sub-segments 40$cc$ extend into the bonding area CC. The third sub-segments 40$cc$ are configured to bond the flexible printed circuit 80 or the driver circuit board in the bonding area CC. The third sub-segments 40$cc$ may be connected to gold fingers of the flexible printed circuit 80 in one-to-one correspondence, and a length of the third sub-segment 40$cc$ in the extension direction thereof is greater than a length of a gold finger 80. For example, the length of the third sub-segment 40$cc$ in the extension direction thereof is 1.1 to 1.5 times (e.g., 1.3 times) the length of the gold finger. As shown in FIGS. 14 and 15, in the plurality of connection traces 40, a distance L1 between an outer edge cc2' of a third sub-segment of a connection trace 40 closest to the first edge-side Ae1 and the first edge-side Ae1 is greater than or equal to 100 μm. In the plurality of connection traces 40, a distance L2 between an outer edge cc2' of a third sub-segment of a connection trace 40 closest to the second edge-side Ae2 and the second edge-side Ae2 is greater than or equal to 100 μm. A distance between the bonding area CC and the selected edge-side Ae' is greater than or equal to 500 μm, and is less than or equal to 10 mm. For example, the distance is 680 μm, 700 μm, or 9 mm.

Considering the technological level and equipment accuracy at the current stage, for example, the flexible printed circuit 80 itself is of error in size, such as ±100 μm. As a result, the flexible printed circuit and the plurality of third trace segments may be misaligned when they are bonded together. Alternatively, in a bonding process, an anisotropic conductive film (ACF) is typically used to connect the flexible printed circuit 80 to the plurality of third trace segments; in an attachment process, a location of the ACF is of an error of ±150 μm, if the distance L1 and the distance L2 are too small, technological requirements and equipment accuracy requirements may not be met, and problems such as bonding misalignment, location error of components, and the like may occur. In a direct bonding process of the third sub-segment 40$cc$ and the flexible printed circuit 80, the distance L1 and the distance L2 are greater than or equal to 100 μm, which may satisfy process requirements and equipment capabilities at the current stage.

For example, on the second surface 10$b$, the distance L1 between the outer edge cc2' of the third sub-segment of the connection trace 40 closest to the first edge-side Ae1 and the first edge-side Ae1 is 100 μm, 110 μm, or 120 μm. The distance L2 between the outer edge cc2' of the third sub-segment of the connection trace 40 closest to the second edge-side Ae2 and the second edge-side Ae2 is 100 μm, 110 μm, or 120 μm. A distance L3 between an outer edge cc2' of a first sub-segment of the connection trace 40 closest to the first edge-side Ae1 and the first edge-side Ae1 may be less than 100 μm. A distance L4 between an outer edge cc2' of a first sub-segment of the connection trace 40 closest to the second edge-side Ae2 and the second edge-side Ae2 may be less than 100 μm.

In some embodiments, as shown in FIGS. 13, 14, 15, and 16, the plurality of connection traces 40 are divided into at least one group G of connection traces, and each group G of connection traces includes at least two connection traces 40. In each group G of connection traces, the extension direction of first sub-segments 40$ca$ and the extension direction of third sub-segments 40$cc$ are the same, and a distance L8 between outer edges cc2' of third sub-segments 40$cc$ of two connection traces 40 that are farthest is less than a distance L9 between outer edges ca2' of first sub-segments 40$ca$ of the two connection traces 40 that are farthest (L8<L9).

In some examples, as shown in FIGS. 13 and 14, the plurality of connection traces 40 on the backplane 10 are one group G of connection traces. In the group G of connection traces, a distance L8 between two outer edges cc2' of third sub-segments on the outermost side is less than a distance L9 between two outer edges ca2' of first sub-segments on the outermost side. The group G of connection traces is electrically connected to a flexible printed circuit 80. That is, in the group G of connection traces, a plurality of third sub-segments gather with respect to a plurality of first sub-segments. In a direction perpendicular to the extension direction of the third sub-segments, an overall dimension of the plurality of third sub-segments is reduced.

Figure 16:
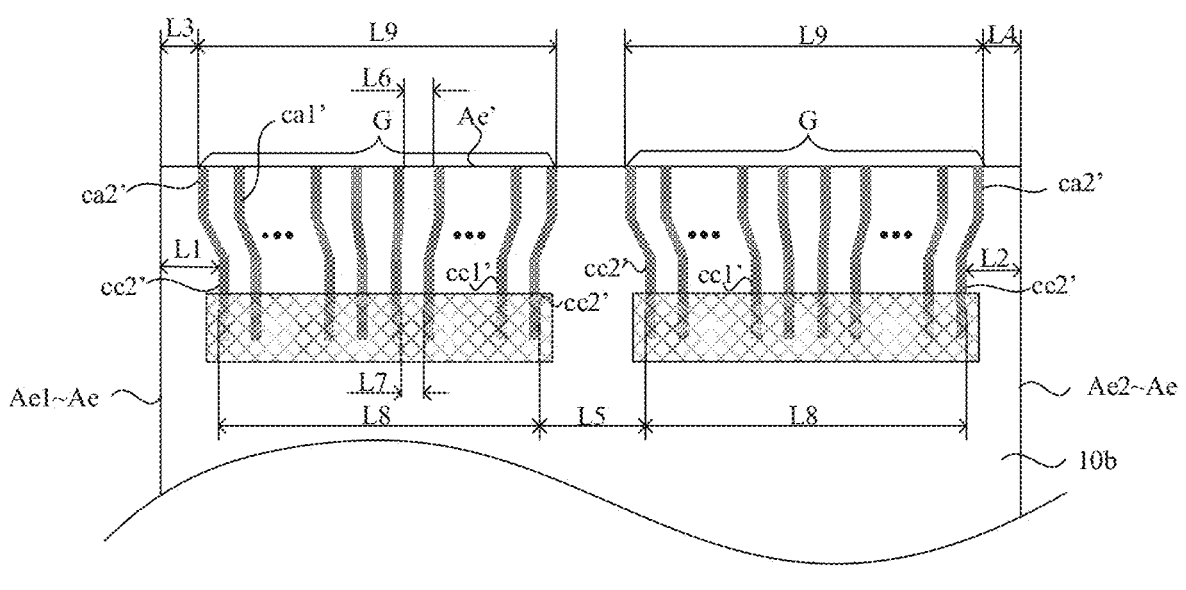
FIG. 16 is an enlarged view of a third trace segment on the non-display surface of the display panel in FIG. 15.

In some other examples, as shown in FIGS. 15 and 16, the plurality of connection traces 40 on the backplane 10 are divided into two groups G of connection traces. In each group G of connection traces, a distance L8 between two outer edges cc2' of third sub-segments on the outermost side is less than a distance L9 between two outer edges ca2' of first sub-segments on the outermost side. Each group G of connection traces is electrically connected to a flexible printed circuit 80. That is, in each group G of connection traces, a plurality of third sub-segments gather with respect to a plurality of first sub-segments. In a direction perpendicular to the extension direction of the third sub-segments, an overall dimension of the plurality of third sub-segments is reduced.

Two flexible printed circuits 80 may be used if the two groups G of connection traces are adopted. That is, a size of each flexible printed circuit 80 may be reduced, which is beneficial to bond the flexible printed circuit 80 to a respective group G of connection traces, and connect the flexible printed circuit 80 to the driver circuit board.

In some embodiments, as shown in FIGS. 15 and 16, in the two adjacent groups G of connection traces, a distance L5 between two outer edges cc2' of third sub-segments of two connection traces that are closest is greater than 1000 μm. For example, the distance L5 is 1010 μm, 1100 μm, or 1200 μm.

As shown in FIG. 15, in the two adjacent groups G of connection traces, two alignment marks M are provided at the location between the two outer edges cc2' of the third sub-segments of the two connection traces that are closest, and the two alignment marks M are used for aligning the flexible printed circuits 80 when they are each bonded. The distance L5 is greater than 1000 μm, which may satisfy processing accuracy requirements and equipment capability requirements. Also, by controlling a minimum value of the distance L5, it may also be possible to avoid a situation that the outer contour of the adjacent flexible printed circuits 80 is too large, which may result in a staking problem. For example, in the two adjacent groups of connection traces, the two alignment marks at the location between outer edges cc2' of the third sub-segments of the two connection traces that are closest should be of different shapes and sizes. For example, the two alignment marks are a cross alignment mark and a circular alignment mark, or a single alignment mark may be shared in the middle of the location between outer edges cc2' of the third sub-segments of the two connection traces that are closest.

In some embodiments, as shown in FIGS. 14 and 16, in two adjacent connection traces 40 of a same group G of connection traces, a distance between an outer edge cc2' of a third sub-segment of a connection trace 40 and a distance between an inner edge cc1' of a third sub-segment of another connection trace 40 is a distance L7 between two adjacent third sub-segments 40cc of the two connection traces 40; a distance between an outer edge ca2' of a first sub-segment of a connection trace 40 and an inner edge ca1' of a first sub-segment of another connection trace 40 is a distance L6 between two adjacent first sub-segments 40ca of the two connection traces 40. The distance L7 between the two adjacent third sub-segments 40cc is less than the distance L6 between the two adjacent first sub-segments 40ca.

In some examples, in two adjacent connection traces of a same group G of connection traces, a distance between an outer edge ca2' of a first sub-segment of a connection trace 40 and an inner edge ca1' of a first sub-segment of another connection trace 40 is in a range from 10 μm to 60 μm. For example, the distance is 10 μm, 40 μm, or 60 μm. A distance between an outer edge cc2' of a third sub-segment of a connection trace 40 and an inner edge cc1' of a third sub-segment of another connection trace 40 is greater than or equal to 10 μm. For example, the distance is 10 μm, 30 μm, or 50 μm.

In each group G of connection traces, the distance L8 is less than the distance L9, and the distance L7 is less than the distance L6, the group G of connection traces shrinks inward relative to the location of the first sub-segments 40ca at the location of the third sub-segments 40cc. In such a design, it may be possible to provide a sufficient space for the distance L1 and the distance L2 to be greater than or equal to 100 μm, thus facilitating the bonding of the flexible printed circuit.

In some embodiments, as shown in FIG. 6, a dimension Wca of the first sub-segment 40ca in a direction perpendicular to an extension direction thereof is greater than or equal to 60 μm. A dimension Wcc of the third sub-segment 40cc in a direction perpendicular to an extension direction thereof is greater than or equal to 60 μm. A dimension Wcb of the second sub-segment 40cb in a direction perpendicular to an extension direction thereof is less than or equal to the dimension Wca of the first sub-segment 40ca in the direction perpendicular to the extension direction thereof.

For example, the dimension Wca of the first sub-segment 40ca in the direction perpendicular to the extension direction thereof is 60 μm, 80 μm, or 90 μm; the dimension Wcc of the third sub-segment 40cc in the direction perpendicular to the extension direction thereof is 60 μm, 65 μm, or 75 μm; and the dimension Wcb of the second sub-segment 40cb in the direction perpendicular to the extension direction thereof is 60 μm, 70 μm, or 80 μm.

In some embodiments, as shown in FIG. 6, a dimension Lca of the first sub-segment 40ca in the extension direction E40ca thereof is greater than or equal to 50 μm (Lca≥50 μm). The angle between the extension direction E40ca of the first sub-segment 40ca and the extension direction E40cb of the second sub-segment 40cb is greater than 100°, and/or the angle between the extension direction E40cc of the third sub-segment 40cc and the extension direction E40cb of the second sub-segment 40cb is greater than 100°; in this case, a dimension Lcb of the second sub-segment 40cb in the extension direction E40cb thereof is greater than or equal to 100 μm (Lcb≥100 μm), and a dimension Lcc of the third sub-segment 40cc in the extension direction E40cc thereof is greater than or equal to 600 μm (Lcc≥600 μm).

For example, for a connection trace 40, dimensions of a first sub-segment 40ca, a second sub-segment 40cb, and a third sub-segment 40ca in respective extension directions are as follows: a dimension Lca of the first sub-segment 40ca in the extension direction thereof is 50 μm, 60 μm, or 90 μm: a dimension Lcb of the second sub-segment 40cb in the extension direction thereof is 100 μm, 120 μm, or 140 μm; and a dimension Lcc of the third sub-segment 40cc in the extension direction thereof is 600 μm, 700 μm, or 800 μm.

Hereinafter, the dimension of the first sub-segment 40ca in the extension direction thereof is a length Lca of the first sub-segment, the dimension of the second sub-segment 40cb in the extension direction thereof is a length Lcb of the second sub-segment, the dimension of the third sub-segment 40cc in the extension direction thereof is a length Lcc of the third sub-segment; and the dimension of the first sub-segment 40ca in the direction perpendicular to the extension direction thereof is a width Wca of the first sub-segment, the dimension of the second sub-segment 40cb in the direction perpendicular to the extension direction thereof is a width Wcb of the second sub-segment, and the dimension of the third sub-segment 40cc in the direction perpendicular to the extension direction thereof is a width Wcc of the third sub-segment.

In some embodiments, the widths of three sub-segments of the third trace segment 40c reduce in sequence.

For example, the width of the first sub-segment 40ca is greater than or equal to the width of the second sub-segment 40cb, and the width of the second sub-segment 40cb is greater than or equal to the width of the third sub-segment 40cc.

Since the three sub-segments of the third trace segment 40c are of different widths, a width of the third trace segment 40c may be represented by an average width AWc. In some embodiments, the average width AWc of the third trace segment 40c is a weighted sum of the width Wca of the first sub-segment 40ca, the width Wcb of the second sub-segment 40cb and the width Wcc of the third sub-segment 40cc. The weight of the width Wca of the first sub-segment 40ca is a ratio of the length Lca of the first sub-segment 40ca to a total length of the third trace segment 40c, the weight of the width Wcb of the second sub-segment 40cb is a ratio of the length Lcb of the second sub-segment 40cb to the total length of the third trace segment 40c, the weight of the width Wcc of the third sub-segment 40*cc* is a ratio of the length Lcc of the third sub-segment 40*cc* to the total length of the third trace segment 40*c*, and reference may be made to the following formula:

$$AWc = \frac{Lca \times Wca}{Lca + Lcb + Lcc} + \frac{Lca \times Wcb}{Lca + Lcb + Lcc} + \frac{Lca \times Wcc}{Lca + Lcb + Lcc}$$

For example, the length Lca of the first sub-segment 40*ca* is 50 μm, and the width Wca of the first sub-segment 40*ca* is 80 μm; the length Lcb of the second sub-segment is 100 μm, and the width Wcb of the second sub-segment is 70 μm; and the length Lcc of the third sub-segment is 600 μm, and the width Wcc of the third sub-segment is 60 μm.

The average width AWc of third trace segment 40*c* is:

$$AWc =$$
$$\frac{50}{50 + 100 + 600} \times 80 + \frac{100}{50 + 100 + 600} \times 70 + \frac{600}{50 + 100 + 600} \times 60 = 62.67$$

That is, the average width AWc of the third trace segment 40*c* is 62.67 μm.

Hereinafter, a dimension of the first trace segment 40*a* in the extension direction thereof is a length La of the first trace segment, a dimension of the second trace segment 40*b* in the extension direction thereof is a length Lb of the second trace segment, and a dimension of the third trace segment 40*c* in the extension direction thereof is a length Lc of the third trace segment; a dimension of the first trace segment 40*a* in a direction perpendicular to the extension direction thereof is a width Wa of the first trace segment, a dimension of the second trace segment 40*b* in a direction perpendicular to the extension direction thereof is a width Wb of the second trace segment, and a dimension of the third trace segment 40*c* in a direction perpendicular to the extension direction thereof is a width Wc of the third trace segment.

In some embodiments, the first trace segment 40*a*, the second trace segment 40*b*, and the third trace segment 40*c* included in a connection trace 40 are of different widths, so that a width of the connection trace 40 is represented by an average width AW. The average width AW of the connection trace 40 is a weighted sum of the width Wa of the first trace segment, the width Wb of the second trace segment, and the width Wc of the third trace segment. The weight of the width Wa of the first trace segment is a ratio of the length La of the first trace segment to a total length of the connection trace 40, the weight of the width Wb of the second trace segment is a ratio of the length Lb of the second trace segment to the total length of the connection trace 40, and the weight of the width Wc of the third trace segment is a ratio of the length Lc of the third trace segment to the total length of the connection trace 40:

$$AW = \frac{La}{La + Lb + Lc} Wa + \frac{Lb}{La + Lb + Lc} Wb + \frac{Lc}{La + Lb + Lc} Wc$$

In some embodiments, the dimension La of the first trace segment 40*a* in the extension direction thereof is greater than or equal to 200 μm (La≥200 μm); the dimension Lb of the second trace segment 40*b* in the extension direction thereof is greater than or equal to 200 μm (Lb≥200 μm); the dimension Lc of the third trace segment 40*c* in the extension direction thereof is greater than or equal to 1200 μm (Lc≥1200 μm).

FIG. 17 is a diagram showing partial structures on a front surface of the display panel 100 provided by embodiments of the present disclosure. In some embodiments, as shown in FIG. 17, average widths of different connection traces 40 are different, and an average width of a connection trace 40 is related to a width of a first electrode 30 electrically connected to the connection trace 40.

In some embodiments, a ratio of a dimension of a first electrode 30 in a direction perpendicular to an extension direction thereof to a dimension of a connection trace 40 electrically connected to the first electrode 30 in a direction perpendicular to an extension direction thereof is in a range from 1 to 3. The dimension of the first electrode 30 in the direction perpendicular to the extension direction thereof is a width W30 of the first electrode, and the dimension of the connection trace 40 in the direction perpendicular to the extension direction thereof is an average width AW of the connection trace 40. The width W30 of the first electrode is directly proportional to the average width AW of the connection trace 40, and an range thereof is from 1 to 3, i.e., $$1 \leq \frac{W30}{AW} \leq 3$$

For example, the first electrode 30 may be configured to transmit a VGB signal, a VR signal, or a constant voltage signal (GND signal), and the first electrode 30 is electrically connected to the signal line 90 located on the first surface of the backplane. For example, the signal line 90 is used to connect the first electrode 30 with the light-emitting device 20. The width of the first electrode 30 is related to the width of the signal line 90 electrically connected thereto, for example, the width of the first electrode 30 is directly proportional to the width of the signal line 90. Based on evaluation of electrical properties, theoretical values of dimensions of different signal lines 90 in a respective direction perpendicular to an extension direction thereof are different, and a dimension of a signal line transmitting the constant voltage signal is the greatest in a direction perpendicular to an extension direction thereof. Thus, the widths of different signal lines 90 are different, the widths of different first electrodes 30 are different, the average widths of different connection traces 30 are also different, and the average width of the connection trace 30 is directly proportional to the width of the signal line 90 electrically connected thereto.

Figure 18:
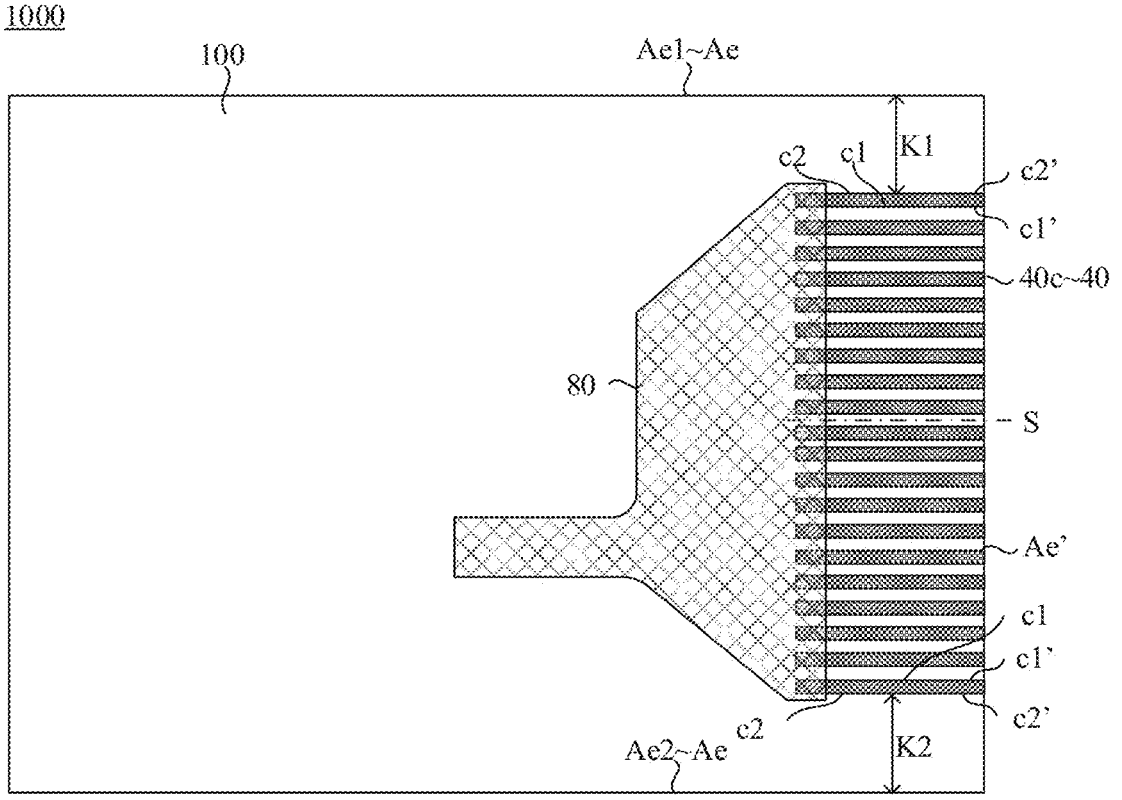
FIG. 18 is a diagram showing structures on a non-display surface of yet another display panel, in accordance with some embodiments of the present disclosure.

As a possible design, as shown in FIG. 18, the plurality of third trace segments 40*c* include a plurality of straight line segments that are arranged in parallel. A junction between the second surface 10*b* and the selected side surface forms a selected edge-side Ae', and two edge-sides Ae adjacent to the selected edge-side Ae' are a first edge-side Ae1 and a second edge-side Ae2. In the plurality of connection traces 40, a distance between a third trace segment 40*c* of a connection trace 40 closest to the first edge-side Ae1 and the first edge-side Ae1 is greater than or equal to 100 μm. In the plurality of connection traces 40, a distance between a third trace segment 40*c* of a connection trace 40 closest to the second edge-side Ae2 and the second edge-side Ae2 is greater than or equal to 100 μm.

For example, in the plurality of connection traces 40, the third trace segments 40*c* are all straight line segments, and are electrically connected to at least one flexible printed circuit 80. At least two third trace segments 40c connected to a same flexible printed circuit 80 have a line of symmetry S perpendicular to the selected side surface. At least two third trace segments 40c connected to a same flexible printed circuit 80 are a group of third trace segments 40c, which corresponds to a line of symmetry S.

Each third trace segment 40c includes two opposite side surfaces: an inner side surface c1 of the third trace segment and an outer side surface c2 of the third trace segment. The inner side surface c1 of the third trace segment is closer to a line of symmetry S with respect to the third trace segment 40c (the line of symmetry S corresponding to a group of third trace segments 40c including the third trace segment 40c) than the outer side surface c2 of the third trace segment. An orthographic projection of the inner side surface c1 of the third trace segment on the second surface 10b is an inner edge c1' of the third trace segment, and an orthographic projection of the outer side surface c2 of the third trace segment on the second surface 10b is an outer edge c2' of the third trace segment. The distance between the third trace segment 40c of the connection trace 40 closest to the first edge-side Ae1 and the first edge-side Ae1 is greater than or equal to 100 μm, that is, as shown in FIG. 18, a distance K1 between the first edge-side Ae1 and an outer edge c2' of the third trace segment closest thereto is greater than or equal to 100 μm. The distance between the third trace segment 40c of the connection trace 40 closest to the second edge-side Ae2 and the second edge-side Ae2 is greater than or equal to 100 μm, that is, as shown in FIG. 18, a distance K2 between the second edge-side Ae2 and an outer edge c2' of the third trace segment closest thereto is greater than or equal to 100 μm.

The third trace segment 40c extends into the bonding area and is electrically connected to the flexible printed circuit. Under the current manufacturing process limitations and equipment accuracy requirements, the flexible printed circuit 80 is of tolerances, such as ±100 μm. As a result, the flexible printed circuit and the plurality of third trace segments may be misaligned when they are bonded. Alternatively, an anisotropic conductive film (ACF) is typically used to connect the plurality of third trace segments with the flexible printed circuit 80; in an attachment process, a location of the ACF is of an error of ±150 μm. Therefore, in the direct bonding process of the third trace segment 40c and the flexible printed circuit 80, the distance K1 and the distance K2 are required to be greater than or equal to 100 μm, which may meet current process requirements and equipment capabilities.

In some embodiments, the connection traces 40 are formed by a laser etching process on a metal layer. A portion of the first surface 10a of the backplane 10 proximate to the selected side surface 10c, a portion of the second surface 10b proximate to the selected side surface 10c, and the selected side surface are sputtered to form a metal layer, then undesired portion of the metal layer is removed by a laser etching process, thus forming the connection traces 40.

When the connection traces are formed by the laser etching process, the laser etching may be performed after the metal layer is formed by sputtering. Compared with a wet etching process, the laser etching process is simple and convenient, and has a high production efficiency. In addition, it is unnecessary to turn over the backplane, which may reduce production materials such as the protective layer, further reduce the production costs, improve the product competitiveness, and reduce scratches and dirt on the display panel as the display panel comes into contact with the equipment, so that it may be possible to improve the yield of the product.

Figure 19:
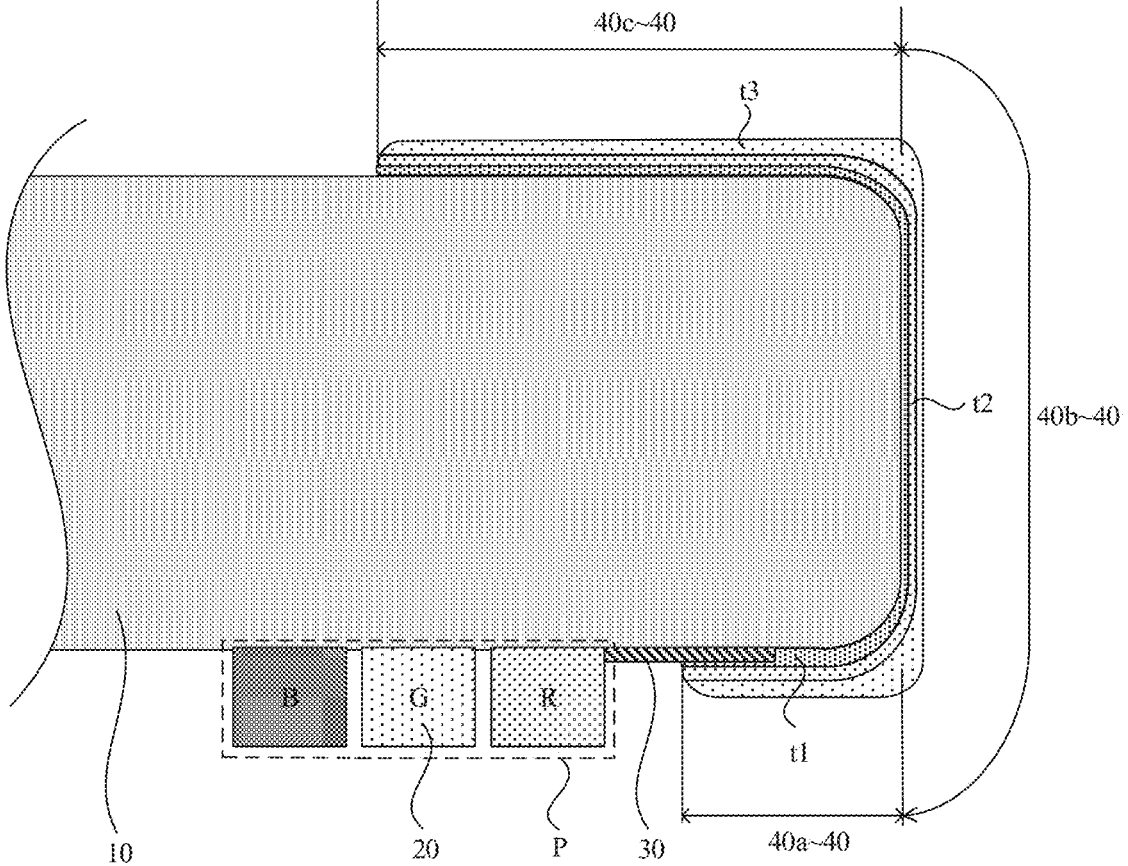
FIG. 19 is a cross-sectional view of a connection trace, in accordance with some embodiments of the present disclosure.

In some embodiments, as shown in FIG. 19, the connection trace 40 includes a first buffer conductive pattern t1, a main conductive pattern t2, and a second buffer conductive pattern t3 that are stacked in sequence. The first buffer conductive pattern t1 is closer to the backplane 10 than the main conductive pattern t2.

For example, a material of the first buffer conductive pattern t1 includes at least one of molybdenum and titanium. A material of the main conductive pattern t2 includes at least one of copper and aluminum. A material of the second buffer conductive pattern t3 includes at least one of molybdenum, titanium, and indium tin oxide.

Figures 20A, 20B:
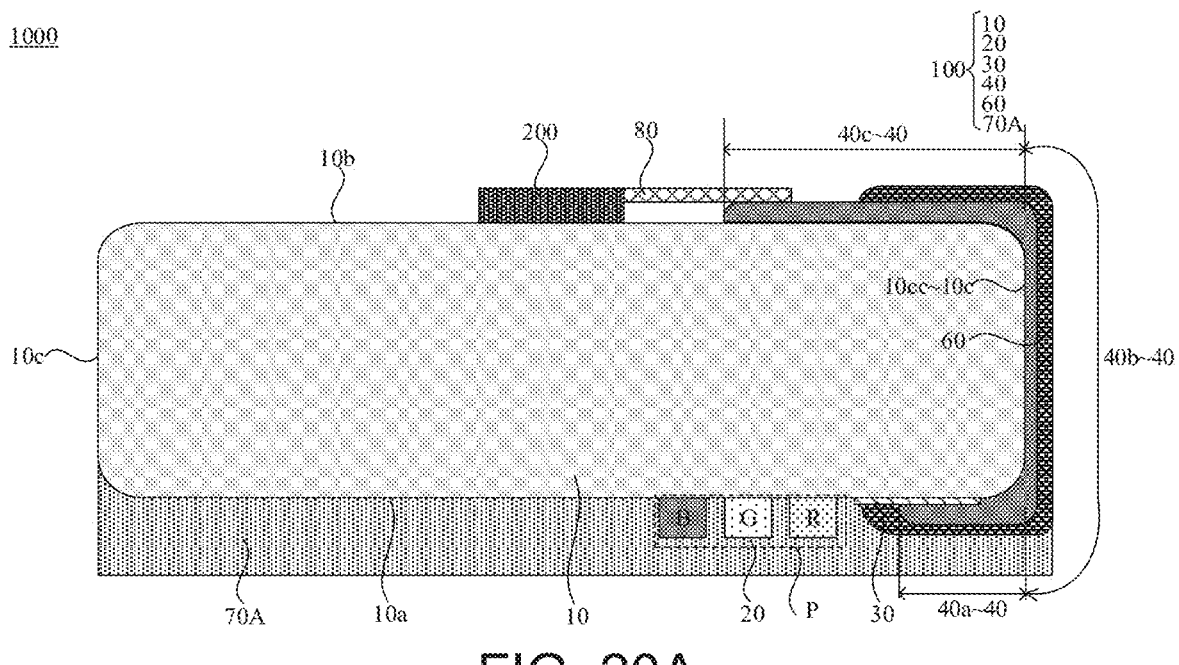
FIG. 20A is a cross-sectional view of a display panel having a first protective layer and a second protective layer, in accordance with some embodiments of the present disclosure.
FIG. 20B is a cross-sectional view of another display panel having a first protective layer and a second protective layer, in accordance with some embodiments of the present disclosure.

In some embodiments, as shown in FIGS. 20A and 20B, the display panel 100 further includes a first protective layer 60 that covers the plurality of first electrodes 30, the first trace segments 40a, the second trace segments 40b, and portions of the third trace segments 40c proximate to the selected side surface 10cc. The first protective layer 60 fills gaps between the plurality of first electrodes 30, gaps of a pattern of the first trace segments 40a, gaps of a pattern of the second trace segment 40b, and gaps of a pattern of the portions of the third trace segments 40c proximate to the selected side surface.

For example, a metal layer is formed on a partial region of the first surface 10a proximate to the selected side surface 10c, a partial region of the second surface 10b proximate to the selected side surface 10c, and the selected side surface 10c, then the metal layer is patterned by a laser etching process to obtain the plurality of connection traces 40. In order to protect the connection traces 40, the first protective layer 60 covering the first trace segments 40a, the second trace segments 40b and the portions of the third trace segments 40c proximate to the selected side surface 10cc is formed, and the first protective layer 60 further covers portions of the first electrodes 30 connected to the connection traces 40.

The first protective layer 60 is made of an insulating material having a high corrosion resistance and a high adhesive power. For example, the first protective layer 60 may be made of over-coating (OC) adhesive, for example, a material of the first protective layer 60 may include a dark OC adhesive or a dark ink. The ink has a high hardness and good corrosion resistance property, and is capable of protecting the plurality of connection traces.

In some embodiments, as shown in FIG. 20A or 20B, the display panel 100 further includes a second protective layer 70A that covers the plurality of light-emitting devices 20 and a portion of the first protective layer 60 located on the first surface 10a, and the second protective layer 70A fills a region between the light-emitting devices 20 and a region between the light-emitting devices 20 and the first electrodes 30.

A material and thickness of a portion of the second protective layer 70A that covers the plurality of light-emitting devices 20 should be selected and set without affecting the set light-emitting brightness of the light-emitting devices 20.

For example, after the first protective layer 60 is formed in a coating process, a protective film (the protective film will be removed in a subsequent process) is attached to the non-display surface of the display panel 100, after which the light-emitting devices 20 are formed on the display surface of the display panel 100, for example, a bonding of LED chips and a bonding of micro control chips are performed, where the micro control chips are used for controlling the LED chips to emit light. After the above process is completed, the second protective layer 70A is attached to the light-emitting devices 20 and the portion of the first protective layer 60 located on the first surface 10*a*. The second protective layer 70A covers the plurality of light-emitting devices 20 and fills gaps between the plurality of light-emitting devices 20 and the region between the light-emitting devices 20 and the first electrodes 30. The second protective layer 70A may be made of an over coating (OC) adhesive. For example, a material of the second protective layer 70A may include a dark OC adhesive or a dark ink. The second protective layer 70A is flat on a side away from the backplane 10.

The second protective layer 70A is configured to protect the plurality of light-emitting devices 20 and has the function of electrical insulation, resistance of moisture and oxygen corrosion, so as to prevent the plurality of light-emitting devices 20 from external damage due to the problem that the plurality of light-emitting devices 20 are fallen off for being bumped, or are oxidized, thus ensuring the light-emitting properties of the light-emitting devices 20.

In some other embodiments, as shown in FIG. 20B, the display panel 100 further includes a third protective layer 70B. The third protective layer 70B covers at least a portion of the first protective layer 60 located on the side surface 10*c* and the second surface 10*b*, and third trace segments 40*c* of the plurality of connection traces 40.

In some examples, the third protective layer 70B covers the portion of the first protective layer 60 located on the side surface 10*c* and the second surface 10*b*, the third trace segments 40*c* of the plurality of connection traces 40, and the entire second surface 10*b*.

For example, after the second protective layer 70A is attached, the flexible printed circuit 80 is bonded to the third sub-segments of the third trace segments 40*c*. For example, the flexible printed circuit 80 is bonded to the third sub-segments of the third trace segments 40*c* by a hot pressing process, then a side of the first protective layer 60 away from the side surface 10*c* and a side of the third trace segment 40*c* away from the second surface 10*b* is coated with the third protective layer 70B. The third protective layer 70B may be a fluorinate layer, and may be made of fluorinating agent. The third protective layer 70B covers the portion of the first protective layer 60 located on the side surface 10*c* and the second surface 10*b*, and portions of the connection traces 40 connected to the flexible printed circuit 80, and covers a portion of the flexible printed circuit 80 bonded to the third sub-segments.

The third protective layer 70B may further protect the display surface and the non-display surface of the display panel, prevent the plurality of connection traces 40, and portions of the connection traces 40 connected to the flexible printed circuit 80 from external damage, moisture and oxygen corrosion, which may affect connection stability.

Figure 21A:
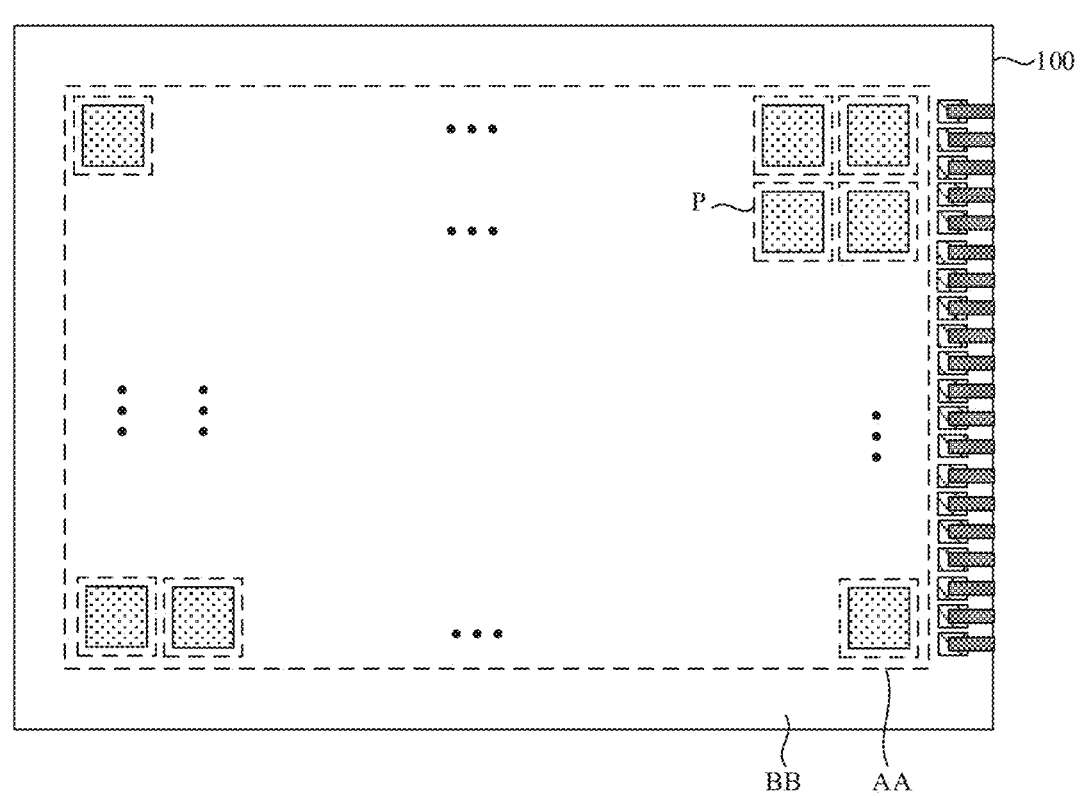
FIG. 21A is a diagram showing structures on a display surface of a display device, in accordance with some embodiments of the present disclosure.
Figure 21B:
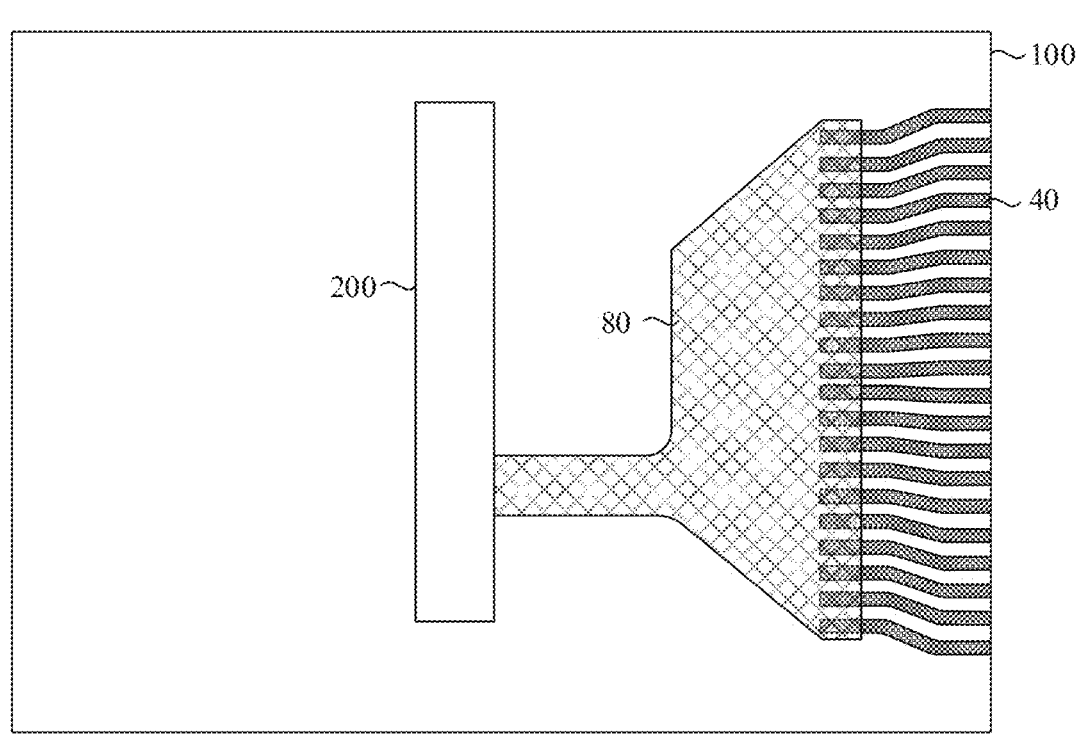
FIG. 21B is a diagram showing structures on a non-display surface of a display device, in accordance with some embodiments of the present disclosure.

As shown in FIGS. 21A and 21B, some embodiments of the present disclosure provide a display device 1000. The display device 1000 includes the display panel 100 provided by any one of the above embodiments and a driver circuit board 200. The driver circuit board 200 is disposed on the second surface 10*b* of the backplane 10 of the display panel 100, and the driver circuit board 200 is electrically connected to the plurality of first electrodes 30 through the flexible printed circuit and the plurality of connection traces 40 of the display panel 100.

For example, an end of the flexible printed circuit is connected to the driver circuit board 200, and the other end of the flexible printed circuit is connected to the third sub-segments 40*cc* of the plurality of connection traces 40 in the bonding area CC.

The display device 1000 adopts the display panel 100 provided by the above embodiments, and has the same technical effects as the display panel 100 described above, and details will not be repeated herein.

Figure 22:
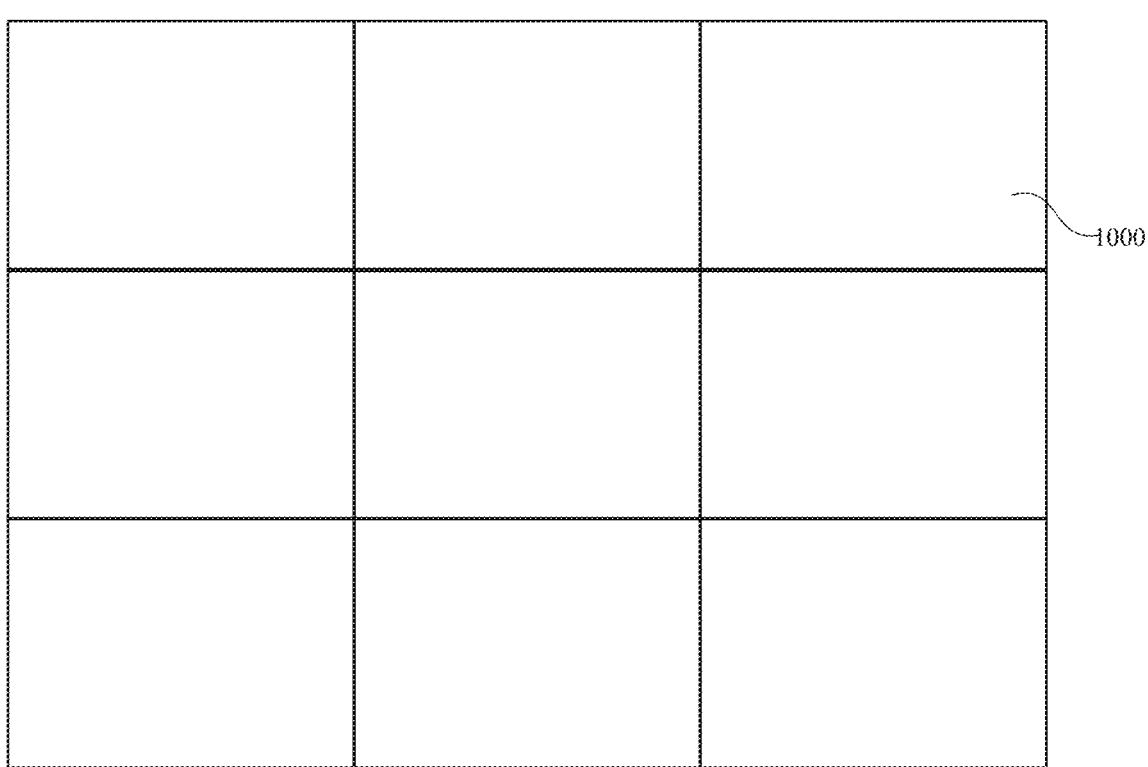
FIG. 22 is a structural diagram of a tiled display apparatus, in accordance with some embodiments of the present disclosure.

As shown in FIG. 22, some embodiments of the present disclosure provide a tiled display apparatus 10000 that includes a plurality of display devices 1000 provided by the above embodiments, the plurality of display devices 1000 are tiled together.

The tiled display apparatus 10000 adopts the display device 1000 provided by the above embodiments, and has the same technical effects as the display device 1000 described above, and details will not be repeated herein.

The foregoing descriptions are merely specific implementations of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a backplane, the backplane including a first surface, a second surface opposite to the first surface, and a plurality of side surfaces connecting the first surface with the second surface, wherein at least one of the plurality of side surfaces is a selected side surface;
   a plurality of light-emitting devices, the plurality of light-emitting devices being disposed on the first surface;
   a plurality of first electrodes, the plurality of first electrodes being disposed on the first surface and proximate to the selected side surface; and
   a plurality of connection traces, each connection trace including a first trace segment, a second trace segment and a third trace segment that are connected in sequence, wherein the first trace segment being disposed on the first surface, and the first trace segment is electrically connected to a first electrode of the plurality of first electrodes; the second trace segment is disposed on the selected side surface; and the third trace segment is disposed on the second surface, and the third trace segment is configured to be electrically connected to a flexible printed circuit, wherein
   the third trace segment includes a first sub-segment, a second sub-segment, and a third sub-segment that are connected in sequence, the first sub-segment is proximate to the selected side surface; and
   first sub-segments of the plurality of connection traces are arranged in parallel, and third sub-segments of the plurality of connection traces are arranged in parallel; and an extension direction of the first sub-segment intersects an extension direction of the second sub-segment, and the extension direction of the second sub-segment intersects an extension direction of the third sub-segment; and an angle formed between the extension direction of the first sub-segment and the extension direction of the second sub-segment is in a range from 90° to 180°.

2. The display panel according to claim 1, wherein the third trace segment further includes a first connection portion, the first sub-segment and the second sub-segment are connected through the first connection portion;

the first connection portion includes a first inner side surface and a first outer side surface that are opposite to each other, an orthographic projection of the first inner side surface on the backplane is a first inner edge, and an orthographic projection of the first outer side surface on the backplane is a first outer edge, the first sub-segment includes an inner side surface of the first sub-segment and an outer side surface of the first sub-segment that are opposite to each other, an orthographic projection of the inner side surface of the first sub-segment on the backplane is an inner edge of the first sub-segment, and an orthographic projection of the outer side surface of the first sub-segment on the backplane is an outer edge of the first sub-segment; and the second sub-segment includes an inner side surface of the second sub-segment and an outer side surface of the second sub-segment that are opposite to each other, an orthographic projection of the inner side surface of the second sub-segment on the backplane is an inner edge of the second sub-segment, and an orthographic projection of the outer side surface of the second sub-segment on the backplane is an outer edge of the second sub-segment;

wherein the first inner edge is connected to the inner edge of the first sub-segment and the inner edge of the second sub-segment, and the first outer edge is connected to the outer edge of the first sub-segment and the outer edge of the second sub-segment.

3. The display panel according to claim 2, wherein the first inner edge is a curve, and/or the first outer edge is a curve;

or the first inner edge is an arc, and/or the first outer edge is an arc.

4. The display panel according to claim 2, wherein the first inner edge includes a plurality of broken line segments that are connected in sequence end-to-end, wherein an angle formed between a broken line segment, in the plurality of broken line segments of the first inner edge, connected to the inner edge of the first sub-segment and the inner edge of the first sub-segment is in a range from 170° to 177°;

an angle formed between two broken line segments that are connected to each other in the plurality of broken line segments of the first inner edge is in a range from 170° to 177°; and an angle formed between a broken line segment, in the plurality of broken line segments of the first inner edge, connected to the inner edge of the second sub-segment and the inner edge of the second sub-segment is in a range from 170° to 177°;

and/or the first outer edge includes another plurality of broken line segments that are connected in sequence end-to-end, wherein an angle formed between a broken line segment, in the plurality of broken line segments of the first outer edge, connected to the outer edge of the first sub-segment and the outer edge of the first sub-segment is in a range from 170° to 177°;

an angle formed between two broken line segments that are connected to each other in the plurality of broken line segments of the first outer edge is in a range from 170° to 177°; and an angle formed between a broken line segment, in the plurality of broken line segments of the first outer edge, connected to the outer edge of the second sub-segment and the outer edge of the second sub-segment is in a range from 170° to 177°.

5. The display panel according to claim 1, wherein an angle formed between the extension direction of the third sub-segment and the extension direction of the second sub-segment is in a range from 90° to 180°.

6. The display panel according to claim 5, wherein the third trace segment further includes a second connection portion, the third sub-segment is connected to the second sub-segment through the second connection portion;

the second connection portion includes a second inner side surface and second outer side surface that are opposite to each other, an orthographic projection of the second inner side surface on the backplane is a second inner edge, and an orthographic projection of the second outer side surface on the backplane is a second outer edge, the third sub-segment includes an inner side surface of the third sub-segment and an outer side surface of the third sub-segment that are opposite to each other, an orthographic projection of the inner side surface of the third sub-segment on the backplane is an inner edge of the third sub-segment, and an orthographic projection of the outer side surface of the third sub-segment on the backplane is an outer edge of the third sub-segment; and the second sub-segment includes an inner side surface of the second sub-segment and an outer side surface of the second sub-segment that are opposite to each other, an orthographic projection of the inner side surface of the second sub-segment on the backplane is an inner edge of the second sub-segment, and an orthographic projection of the outer side surface of the second sub-segment on the backplane is an outer edge of the second sub-segment;

wherein the second inner edge is connected to the inner edge of the third sub-segment and the inner edge of the second sub-segment, and the third outer edge is connected to the outer edge of the third sub-segment and the outer edge of the second sub-segment.

7. The display panel according to claim 6, wherein the second inner edge is a curve, and/or the second outer edge is a curve;

or the second inner edge is an arc, and/or the second outer edge is an arc.

8. The display panel according to claim 6, wherein the second inner edge includes a plurality of broken line segments that are connected in sequence end-to-end, wherein an angle formed between a broken line segment, in the plurality of broken line segments of the second inner edge, connected to the inner edge of the third sub-segment and the inner edge of the third sub-segment is in a range from 170° to 177°;

an angle formed between two broken line segments that are connected to each other in the plurality of broken line segments of the second inner edge is in a range from 170° to 177°; and an angle formed between a broken line segment, in the plurality of broken line segments of the second inner edge, connected to the inner edge of the second sub-segment and the inner edge of the second sub-segment is in a range from 170° to 177°;

and/or the second outer edge includes another plurality of broken line segments that are connected in sequence end-to-end, wherein an angle formed between a broken line segment, in the plurality of broken line segments of the second outer edge, connected to the outer edge of the third sub-segment and the outer edge of the third sub-segment is in a range from 170° to 177°;

an angle formed between two broken line segments that are connected to each other in the plurality of broken line segments of the second outer edge is in a range from 170° to 177°; and an angle formed between a broken line segment, in the plurality of broken line segments of the second outer edge, connected to the outer edge of the second sub-segment and the outer edge of the second sub-segment is in a range from 170° to 177°.

9. The display panel according to claim 6, wherein the plurality of connection traces are divided into at least one group of connection traces, and each group of connection traces includes at least two connection traces;

in each group of connection traces, an extension direction of first sub-segments and an extension direction of third sub-segments are same, and a distance between outer edges of third sub-segments of two connection traces that are farthest is less than a distance between outer edges of first sub-segments of the two connection traces that are farthest.

10. The display panel according to claim 9, wherein in two adjacent connection traces in a same group of connection traces, a distance between two adjacent third sub-segments is less than a distance between two adjacent first sub-segments, wherein the distance between the two adjacent third sub-segments is a distance between an outer edge of a third sub-segment and an inner edge of another third sub-segment, and the outer edge of the third sub-segment and the inner edge of the another third sub-segment are proximate to each other; and the distance between the two adjacent first sub-segments is a distance between an outer edge of a first sub-segment and an inner edge of another first sub-segment, and the outer edge of the first sub-segment and the inner edge of the another first sub-segment are proximate to each other.

11. The display panel according to claim 9, wherein a distance between first sub-segments of two adjacent connection traces in the group of connection trace is in a range from 10 μm to 60 μm.

12. The display panel according to claim 9, wherein a distance between third sub-segments of two adjacent connection traces in the group of connection trace is greater than or equal to 10 μm.

13. The display panel according to claim 1, wherein a junction between the second surface and each side surface of the plurality of side surfaces forms an edge-side, a junction between the second surface and the selected side surface forms a selected edge-side, and two edge-sides adjacent to the selected edge-side are a first edge-side and a second edge-side;

in the plurality of connection traces, a distance between a third sub-segment of a connection trace closest to the first edge-side and the first edge-side is greater than or equal to 100 μm; and in the plurality of connection traces, a distance between a third sub-segment of a connection trace closest to the second edge-side and the second edge-side is greater than or equal to 100 μm.

14. The display panel according to claim 1, wherein a ratio of a dimension of the first electrode in a direction perpendicular to an extension direction thereof to a dimension of the connection trace electrically connected to the first electrode in a direction perpendicular to an extension direction thereof is in a range from 1 to 3.

15. The display panel according to claim 1, wherein the angle formed between the extension direction of the first sub-segment and the extension direction of the second sub-segment is in a range from 100° to 180°, and/or an angle formed between the extension direction of the third sub-segment and the extension direction of the second sub-segment is in a range from 100° to 180°;

a dimension of the second sub-segment in the extension direction thereof is greater than or equal to 100 μm.

16. The display panel according to claim 1, wherein the second surface includes a bonding area; the third sub-segment extends into the bonding area, and the third sub-segment is configured to bond the flexible printed circuit in the bonding area.

17. A display device, comprising:

the display panel according to claim 1;

a driver circuit board, the driver circuit board being disposed on the second surface of the backplane of the display panel, and a flexible printed circuit;

wherein the driver circuit board is electrically connected to the plurality of first electrodes of the display panel through the flexible printed circuit and the plurality of connection traces of the display panel.

18. A tiled display apparatus, comprising: a plurality of display devices each according to claim 17, the plurality of display devices being tiled together.

19. A display panel, comprising:

a backplane, the backplane including a first surface, a second surface opposite to the first surface, and a plurality of side surfaces connecting the first surface with the second surface, wherein at least one of the plurality of side surfaces is a selected side surface;

a plurality of light-emitting devices, the plurality of light-emitting devices being disposed on the first surface;

a plurality of first electrodes, the plurality of first electrodes being disposed on the first surface and proximate to the selected side surface; and a plurality of connection traces, each connection trace including a first trace segment, a second trace segment and a third trace segment that are connected in sequence, wherein the first trace segment being disposed on the first surface, and the first trace segment is electrically connected to a first electrode of the plurality of first electrodes; the second trace segment is disposed on the selected side surface; and the third trace segment is disposed on the second surface, and the third trace segment is configured to be electrically connected to a flexible printed circuit, wherein a plurality of third trace segments of the plurality of connection traces include a plurality of straight line segments that are arranged in parallel;

a junction between the second surface and the selected side surface forms a selected edge-side, and two edge-sides adjacent to the selected edge-side are a first edge-side and a second edge-side;

in the plurality of connection traces, a distance between a third trace segment of a connection trace closest to the first edge-side and the first edge-side is greater than or equal to 100 μm; and in the plurality of connection traces, a distance between a third trace segment of a connection trace closest to the second edge-side and the second edge-side is greater than or equal to 100 μm.

20. A display panel, comprising:

a backplane, the backplane including a first surface, a second surface opposite to the first surface, and a plurality of side surfaces connecting the first surface with the second surface, wherein at least one of the plurality of side surfaces is a selected side surface;

a plurality of light-emitting devices, the plurality of light-emitting devices being disposed on the first surface;

a plurality of first electrodes, the plurality of first electrodes being disposed on the first surface and proximate to the selected side surface; and a plurality of connection traces, each connection trace including a first trace segment, a second trace segment and a third trace segment that are connected in sequence, wherein the first trace segment being disposed on the first surface, and the first trace segment is electrically connected to a first electrode of the plurality of first electrodes; the second trace segment is disposed on the selected side surface; and the third trace segment is disposed on the second surface, and the third trace segment is configured to be electrically connected to a flexible printed circuit, wherein a ratio of a dimension of the first electrode in a direction perpendicular to an extension direction thereof to a dimension of the connection trace electrically connected to the first electrode in a direction perpendicular to an extension direction thereof is in a range from 1 to 3.

* * * * *